United States Patent
Mathur et al.

(10) Patent No.: US 11,222,889 B2
(45) Date of Patent: Jan. 11, 2022

(54) ELECTROSTATIC DISCHARGE PROTECTION CIRCUIT

(71) Applicant: Western Digital Technologies, Inc., San Jose, CA (US)

(72) Inventors: Shiv Harit Mathur, Bangalore (IN); Ramakrishnan Subramanian, Bangalore (IN)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 339 days.

(21) Appl. No.: 16/189,778

(22) Filed: Nov. 13, 2018

(65) Prior Publication Data

US 2020/0153241 A1    May 14, 2020

(51) Int. Cl.
*H01L 27/02* (2006.01)
*H02H 9/04* (2006.01)

(52) U.S. Cl.
CPC ......... *H01L 27/0285* (2013.01); *H02H 9/046* (2013.01)

(58) Field of Classification Search
CPC ........ H02H 9/045; H02H 9/046; H02H 3/021; H02H 3/027; H02H 3/04; H02H 3/066; H02H 3/093; H02H 3/22; H02H 7/1209; H01L 27/0285; H01L 27/0251; H01L 27/0266; H01L 27/0288
See application file for complete search history.

(56) References Cited

U.S. PATENT DOCUMENTS

| | | | | |
|---|---|---|---|---|
| 5,838,146 A | * | 11/1998 | Singer | H02H 9/046 323/270 |
| 8,320,091 B2 | * | 11/2012 | Salcedo | H02H 9/046 361/111 |
| 2003/0201457 A1 | * | 10/2003 | Lin | H01L 27/0266 257/173 |
| 2006/0176626 A1 | * | 8/2006 | Griesbach | H03K 17/08122 361/56 |
| 2011/0267723 A1 | * | 11/2011 | Stockinger | H01L 27/0285 361/56 |
| 2011/0317316 A1 | * | 12/2011 | Mozak | H01L 27/0285 361/56 |
| 2012/0176710 A1 | * | 7/2012 | Domanski | H02H 9/046 361/56 |
| 2012/0286752 A1 | * | 11/2012 | Tsukiji | H04N 5/63 323/282 |
| 2013/0170081 A1 | * | 7/2013 | Singh | H02H 9/046 361/56 |
| 2013/0258533 A1 | * | 10/2013 | Chen | H02H 9/046 361/56 |
| 2013/0308234 A1 | * | 11/2013 | Hyvonen | H02H 9/046 361/56 |

(Continued)

*Primary Examiner* — Alex Torres-Rivera
(74) *Attorney, Agent, or Firm* — Loza & Loza, LLP; Gabriel Fitch

(57) ABSTRACT

The disclosure relates in some aspects to electrostatic discharge (ESD) protection for an electronic circuit. In some aspects, the ESD protection includes a buffer circuit that increases the slew rate of a signal that controls a discharge circuit. In some aspects, the ESD protection includes a voltage-dependent resistance circuit that adjusts a time constant of a resistive-capacitive filter based on a voltage on a supply node.

23 Claims, 14 Drawing Sheets

(56) References Cited

U.S. PATENT DOCUMENTS

| | | | |
|---|---|---|---|
| 2014/0198415 A1* | 7/2014 | Schulmeyer | H02H 9/046 361/56 |
| 2014/0211349 A1* | 7/2014 | Braun | H02H 9/046 361/56 |
| 2014/0268441 A1* | 9/2014 | Mallikarjunaswamy | H03K 17/08104 361/56 |
| 2015/0229125 A1* | 8/2015 | Kato | H02H 9/046 361/56 |
| 2015/0349776 A1* | 12/2015 | Abouda | H03K 19/017509 327/109 |
| 2017/0126001 A1 | 5/2017 | Altaras et al. | |
| 2017/0133840 A1* | 5/2017 | Loiseau | H02H 9/046 |
| 2017/0373494 A1* | 12/2017 | Pok | H01L 27/0251 |
| 2018/0083443 A1* | 3/2018 | Mertens | H02H 9/046 |
| 2018/0374840 A1* | 12/2018 | Fukasaku | H01L 27/0705 |
| 2019/0080769 A1* | 3/2019 | Shiraishi | G11C 7/1078 |
| 2019/0260203 A1* | 8/2019 | Seidl | H02H 1/0007 |

* cited by examiner

ELECTROSTATIC DISCHARGE PROTECTION CIRCUIT

FIELD

The disclosure relates, in some embodiments, to an electrostatic discharge protection circuit. More specifically, but not exclusively, the disclosure relates to an electrostatic discharge protection circuit for a non-volatile memory (NVM) devices.

INTRODUCTION

Electrostatic discharge (ESD) events may involve, for example, a sudden flow of electricity between two electrically charged objects. When an ESD event occurs, an accumulation of charge from the sudden flow of electricity may generate an ESD voltage that may peak at a relatively high level, which may cause damage to an electronic circuit.

Consequently, an electronic circuit may include ESD protection to prevent an ESD event from damaging the electronic circuit. For example, an ESD protection circuit may include a discharge circuit (also referred to as a clamp circuit) that limits the magnitude of an ESD voltage to a level that will not damage the electronic circuit.

In practice, ESD protection circuits may be relatively large. However, in electronic circuits such as integrated circuits, it is desirable to use as much of the available circuit area as possible for the functional circuits (e.g., a memory array, processing circuits, etc.). Thus, there is a need for effective techniques for providing ESD protection without consuming a large amount of the circuit area of an electronic circuit.

SUMMARY

The following presents a simplified summary of some aspects of the disclosure to provide a basic understanding of such aspects. This summary is not an extensive overview of all contemplated features of the disclosure, and is intended neither to identify key or critical elements of all aspects of the disclosure nor to delineate the scope of any or all aspects of the disclosure. Its sole purpose is to present various concepts of some aspects of the disclosure in a simplified form as a prelude to the more detailed description that is presented later.

One embodiment of the disclosure provides an electrostatic discharge protection circuit that includes: a discharge circuit configured to discharge current from a first node to a second node; a first timer circuit configured to generate a first signal in response to an electrostatic discharge event; an activation circuit coupled to the first timer circuit and the discharge circuit to activate the discharge circuit for a first period of time in response to the first signal; a second timer circuit coupled to the first timer circuit to generate a second signal in response to the first signal; and a buffer circuit coupled to the second timer circuit to generate a third signal to activate the discharge circuit for a second period of time in response to the second signal.

In some aspects, the second timer circuit may be configured to generate the second signal at a first slew rate, and the buffer circuit may be configured to generate the third signal at a second slew rate that is faster than the first slew rate. In some aspects, the buffer circuit may include a first inverter circuit coupled to a second inverter circuit. In some aspects, the second timer circuit and the buffer circuit may be configured to commence the second time period after the first time period commences and to end the second time period after the first time period ends.

In some aspects, the second timer circuit may include a voltage-dependent resistance circuit to adjust a resistive-capacitive time constant based on a voltage on the first node. In some aspects, the voltage-dependent resistance circuit comprises a PMOS transistor in series with a resistor. In some aspects, the electrostatic discharge protection circuit may further include a driver circuit coupled to the first timer circuit to receive the first signal, wherein an output of the driver circuit is coupled to a gate of the PMOS transistor. In some aspects, the second timer circuit may further include an NMOS transistor coupled in series with the PMOS transistor, the output of the driver circuit may be coupled to a gate of the NMOS transistor, and an output node for the PMOS transistor and the NMOS transistor may be configured to provide the second signal.

In some aspects, the activation circuit may include a PMOS transistor including a first gate and a drain, the discharge circuit may include an NMOS transistor including a second gate, the first gate may be coupled to the first timer circuit to receive the first signal, and the drain may be coupled to the second gate. In some aspects, the electrostatic discharge protection circuit may further include a driver circuit coupled to the buffer circuit to receive the third signal, wherein an output of the driver circuit is coupled to the second gate.

One embodiment of the disclosure provides an electrostatic discharge protection circuit that includes: means for discharging current from a first node to a second node; means for generating a first signal in response to an electrostatic discharge event; means for activating the means for discharging for a first period of time in response to the first signal; means for generating a second signal in response to the first signal; and means for buffering the second signal to generate a third signal to activate the means for discharging for a second period of time. In some aspects, the means for generating a second signal and the means for buffering may be configured to commence the second time period after the first time period commences and to end the second time period after the first time period ends, such that the first time period and the second time period partially overlap.

In some aspects, the means for generating a second signal may be configured to generate the second signal at a first slew rate, and the means for buffering may be configured to generate the third signal at a second slew rate that is faster than the first slew rate. In some aspects, the means for generating a second signal may include means for adjusting a resistive-capacitive time constant based on a voltage on the first node. In some aspects, the electrostatic discharge protection circuit may further include first means for driving a signal coupled to the means for generating a first signal and the means for generating a second signal, wherein the first means for driving a signal is configured to provide a fourth signal based on the first signal to the means for generating a second signal. In some aspects, the electrostatic discharge protection circuit may further include second means for driving a signal coupled to the means for buffering and the means for discharging, wherein the second means for driving a signal is configured to generate a fifth signal based on the third signal to activate the means for discharging.

One embodiment of the disclosure provides an electrostatic discharge protection method. The method may include: detecting an electrostatic discharge event; generating a first signal in response to the detection of the electrostatic discharge event; activating a discharge circuit between a first node and a second node for a first period of time in response to the first signal; generating a second signal in response to the first signal; buffering the second signal to generate a third signal; and activating the discharge circuit for a second period of time in response to the third signal.

These and other aspects of the disclosure will become more fully understood upon a review of the detailed description, which follows. Other aspects, features, and implementations of the disclosure will become apparent to those of ordinary skill in the art, upon reviewing the following description of specific implementations of the disclosure in conjunction with the accompanying figures. While features of the disclosure may be discussed relative to certain implementations and figures below, all implementations of the disclosure can include one or more of the advantageous features discussed herein. In other words, while one or more implementations may be discussed as having certain advantageous features, one or more of such features may also be used in accordance with the various implementations of the disclosure discussed herein. In similar fashion, while certain implementations may be discussed below as device, system, or method implementations it should be understood that such implementations can be implemented in various devices, systems, and methods.

BRIEF DESCRIPTION OF THE DRAWINGS

A more particular description is included below with reference to specific embodiments illustrated in the appended drawings. Understanding that these drawings depict only certain embodiments of the disclosure and are not therefore to be considered to be limiting of its scope, the disclosure is described and explained with additional specificity and detail through the use of the accompanying drawings, in which.

DETAILED DESCRIPTION

In the following detailed description, reference is made to the accompanying drawings, which form a part thereof. In addition to the illustrative aspects, embodiments, and features described above, further aspects, embodiments, and features will become apparent by reference to the drawings and the following detailed description. The description of elements in each figure may refer to elements of proceeding figures. Like numbers may refer to like elements in the figures, including alternate embodiments of like elements.

ESD is the sudden flow of electricity between two electrically charged objects caused by, for example, contact, an electrical short, or dielectric breakdown between the objects. It is estimated that ESD causes more than one-third of the field failures in the semiconductor industry. The ever decreasing size of semiconductor chips, as well as the use of thin gate oxides, multiple power supplies, chip complexity, and high-speed circuit operation contribute significantly to ESD sensitivity and risk.

The disclosure relates in some aspects to ESD protection for an electronic circuit. In some aspects, the ESD protection includes a buffer circuit that increases the slew rate of a signal that controls a discharge circuit. In some aspects, the ESD protection includes a voltage-dependent resistance circuit that adjusts a time constant of a resistive-capacitive filter based on a voltage on a supply node.

The ESD protection may include a discharge circuit to discharge charge on a supply line in response to detection of an ESD event. The charge on the supply line may be discharged through a discharge path for a period of time commencing when a first timing window opens and ending when a second timing window closes. The first timing window may also be used to detect ESD events. The two timing windows may allow an initial period of the ESD voltage on the supply line to be suppressed before the second timing window opens, and may further allow a remaining period of the ESD event following the initial period to be suppressed after the first timing window closes.

Figure 1:
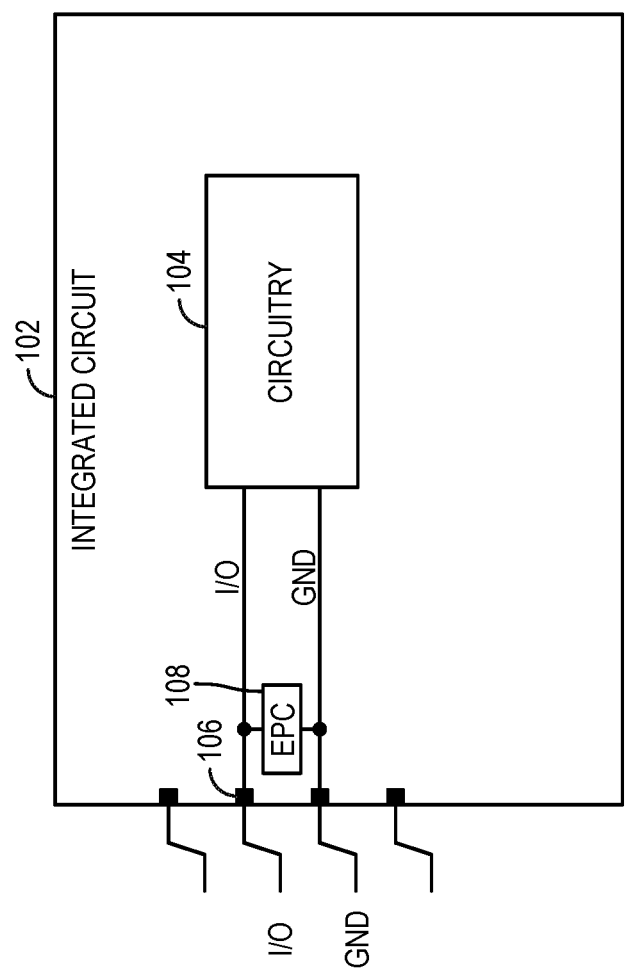
FIG. 1 illustrates an integrated circuit including ESD protection in accordance with one or more aspects of the disclosure.

FIG. 1 illustrates an example of an integrated circuit 102 that includes circuitry 104 that is connected to an external signal node (e.g., a pad) 106. As used herein, the term external signal node (or external signal path) refers to a node (or path) that can connect to circuitry external to an integrated circuit (or some other circuit that includes the node or path). In the example of FIG. 1, the external signal node 106 is for input and/or output (I/O) signaling. An external signal node (or path) could be used for other types of signals. For example, an external signal node could be for an external decoupling capacitor. As another example, an external signal node could be for an internal node (e.g., a test pad that is used only for testing) that is not bonded out.

The integrated circuit 102 includes an ESD protection circuit (EPC) 108 for protecting the circuitry 104 in the event an ESD event occurs at the external signal node 106. Other external signal pads may be connected to similar ESD protection circuits (not shown). The ESD protection circuit 108 includes clamps and/or diodes that limit the voltage during an ESD event so that the voltage remains below a destructive voltage for the circuitry 102, thereby protecting the circuitry 102. In the example of FIG. 1, an ESD event at the external signal node 106 may cause the ESD protection circuit 108 to temporarily couple the external signal node 106 to ground (GND). By redirecting current flow caused by the ESD event to flow to ground, the magnitude of the voltage inducted at the circuitry 104 can be controlled to an acceptable level.

Figure 2:
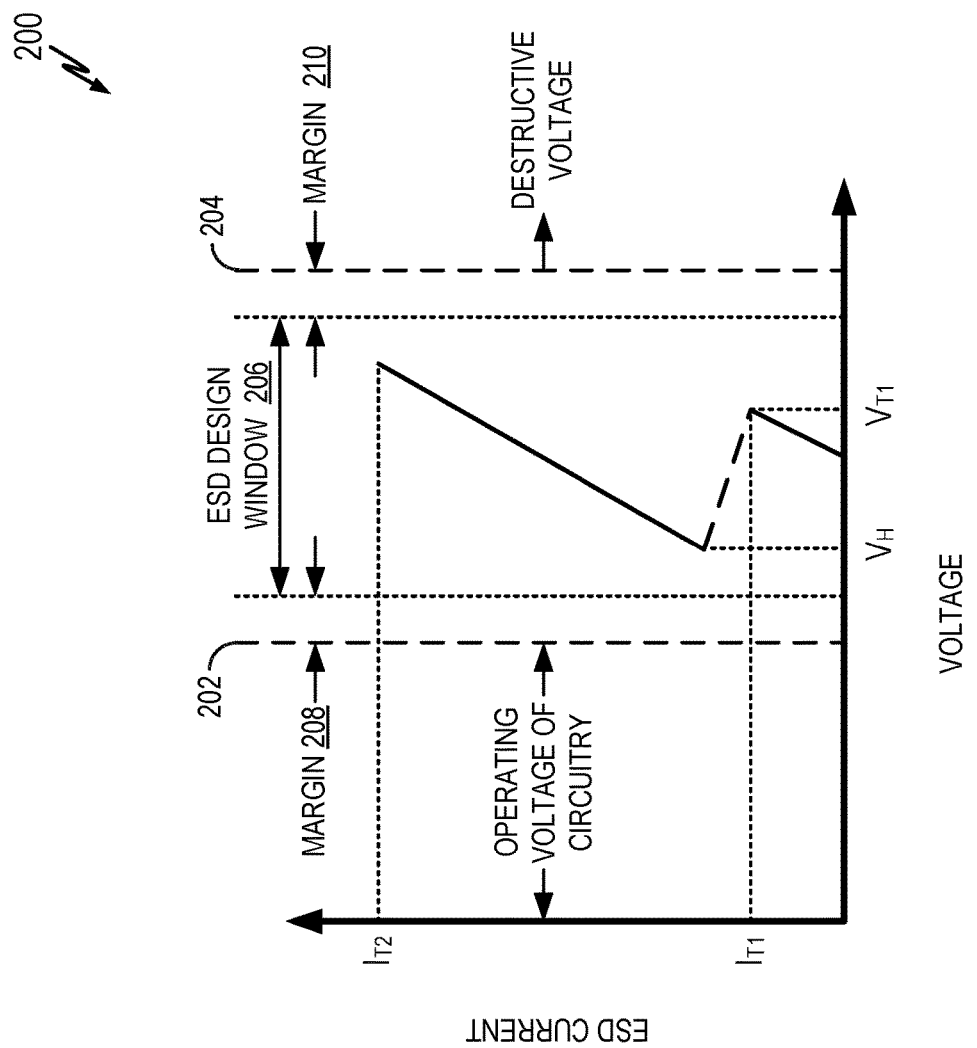
FIG. 2 illustrates an example of an ESD design window.

FIG. 2 illustrates an example of an ESD design window 200 for protecting an electronic circuit. The X-axis is the voltage at the electronic circuit (e.g., an input of a transistor) and the Y-axis is the current resulting from the ESD event. The electronic circuit has a maximum operating voltage 202 and a destructive voltage 204 (e.g., a breakdown voltage) that depend on the particular technology being used. An ESD protection circuit is designed to prevent the ESD-induced voltage from exceeding the destructive voltage at the input to the electronic circuit, without causing the voltage input to the electronic circuit to drop below the operating voltage range (e.g., a direct short to ground is not desired). Thus, in the above example, the ESD design window 206 is on the order of 2 V.

The following terminology is used in FIG. 2. $V_{T1}$ is the triggering voltage that triggers activation of the ESD protection circuit (e.g., turning on a clamp circuit). $I_{T1}$ is the triggering current (e.g., the current flow at $V_{T1}$). $V_H$ is the holding voltage (e.g., if there is a voltage snapback at the ESD protection circuit). $I_{T2}$ is the current failure threshold (e.g., current exceeding this threshold may damage the electronic circuit). $V_{T2}$ is the voltage at $I_{T2}$. FIG. 2 also shows a margin 208 for the maximum operating voltage 202 and a margin 210 for the destructive voltage 204 corresponding to, for example, process and temperature variations.

Typically, an ESD protection circuit includes a trigger circuit that controls (e.g., turns on/off) the gate of one or more NMOS devices that serve as a clamp. Such an ESD protection circuit may include protection diodes and resistors to divert the charge of an ESD event through the NMOS device(s) and/or pads associated with a reference node. In an ESD event that occurs between two I/O pads, the accumulated charge may try to find a path to a reference node.

Figure 3:
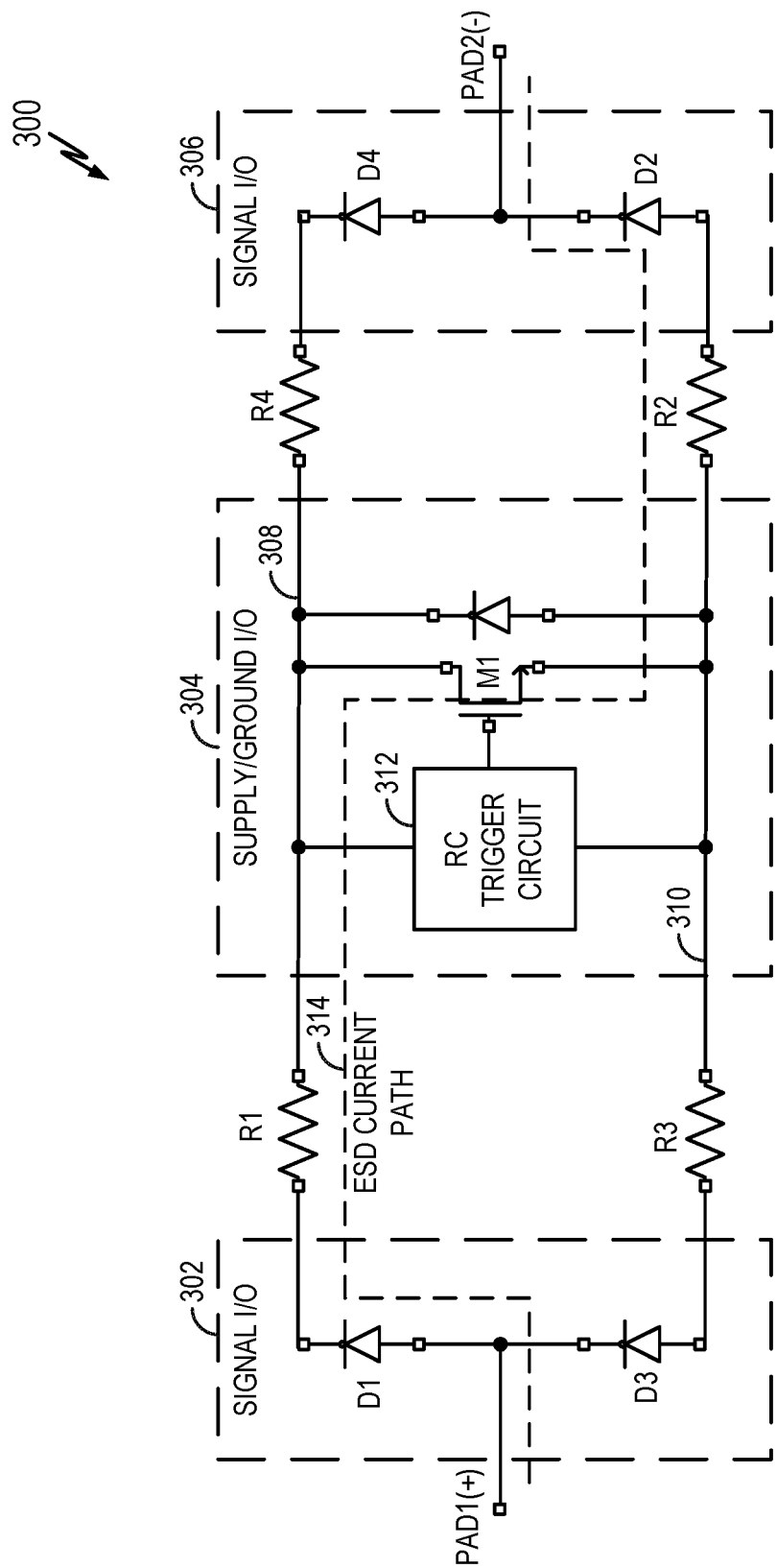
FIG. 3 illustrates an example of a current path for an ESD event.

FIG. 3 illustrates an example of ESD current discharge for an ESD event on an pad of an I/O circuit 300 that includes ESD protection circuit elements that assist in the discharge. By discharging the ESD current from the pad, the peak voltage on the pad is limited, and thereby protect other devices across the device (not shown) from the ESD event. The I/O circuit 300 includes a first signal I/O circuit 302 coupled to a first I/O pad PAD1(+), a supply/ground I/O circuit 304, and a second signal I/O circuit 306 coupled to a second I/O pad PAD2(−). The first signal I/O circuit 302 and the second signal I/O circuit 306 are coupled to, for example, a supply rail 308 (e.g., VDDO) and a ground rail 310 via protection diodes D1-D4. Resistance along these paths are indicated by the resistances R1-R4. In some implementations, the second I/O PAD2(−) may be coupled to a circuit ground.

The supply/ground I/O circuit 304 includes a resistive-capacitive (RC) trigger circuit 312 that controls an NMOS clamp (including transistor M1). When an ESD event (e.g., a +V charge) occurs at the first I/O pad PAD1(+), the protection diodes D1 and D2 provide an ESD current path 314 from the first I/O pad PAD1(+) to the second I/O pad PAD2(−). Specifically, discharge current may flow from the first I/O pad PAD1(+), through the diode D1, the resistance R1, the supply path 308, the transistor M1, the ground path 310, the resistance R2, and the diode D2 to the second I/O pad PAD2(−). Alternatively, if the first I/O pad has a negative ESD charge relative to the second I/O pad, discharge current may flow from the second I/O pad, through the diode D4, the resistance R4, the supply path 308, the transistor M1, the ground path 310, the resistance R3, and the diode D3 to the first I/O pad.

The RC trigger circuit 312 includes a driver stage (not shown) that turns on the NMOS clamp when an ESD event occurs. The driver stage provides a current path to charge the gate of the transistor M1 as shown in FIG. 3, and thereby achieve the clamping action by turning on the NMOS clamp.

The RC trigger circuit 312 may also include timing elements that turn off the NMOS clamp after the ESD event is over and that do not let the NMOS clamp turn on during a power-up condition (e.g., when a chip is in a normal operating mode). For example, a timer circuit may ensure that the NMOS clamp turns off after discharging the ESD charge to a voltage level that is below the functional stress level. To this end, the timer circuit may provide a delay on the order of microseconds or more.

Conventionally, an ESD protection circuit uses relatively large active circuit elements and passive circuit elements. For example, since ESD protection is desirable even when an integrated circuit chip is not operating in its normal function mode (e.g., during manufacture and test), passive elements are typically used to provide ESD protection. Thus, relatively large passive elements such as resistors and capacitors may be used to provide the timing delay discussed above.

Conventional ESD Protection Circuits

Figure 4:
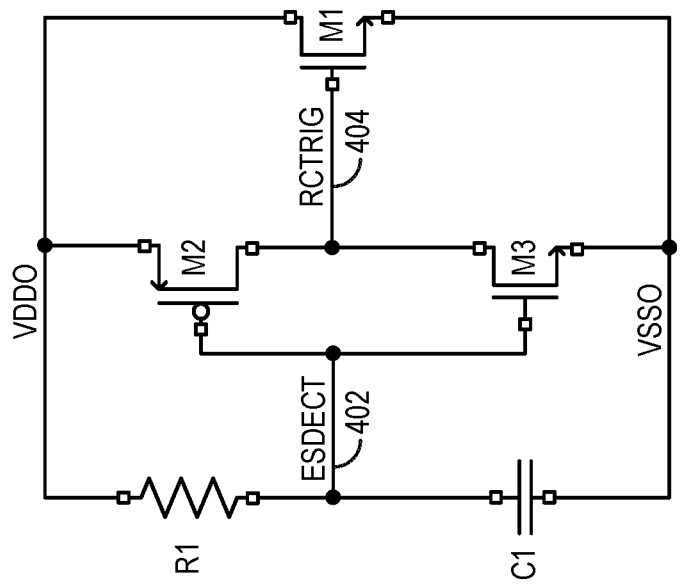
FIG. 4 illustrates an example ESD protection circuit.

FIG. 4 illustrates an example of a single-stage ESD protection circuit 400. In the absence of an ESD event, the transistors M2 and M1 are off. The transistor M2 turns-on when an ESD event is detected through RC stage (resistor R1 and capacitor C1). For a period of time (dependent on the RC value of the resistor R1 and capacitor C1) after the detection of the ESD event, the esdect signal 402 remains low, thereby turning on the transistor M2 which pulls up the rctrig signal 404. This turns on the transistor M1 which discharges ESD current from the VDDO rail to the VSSO rail, thereby clamping the voltage across VDDO and VSSO to a safe level.

In practice (e.g., for cases where the desired RC value or clamp width can be implemented in silicon), the single-stage ESD protection circuit 400 doesn't support fast ramp rates such as those that may be seen during hot insertion (e.g., when a circuit card is plugged into a powered-on system). In some cases, the ramp rates during hot insertion can be as high as 500 ns.

In addition, the gain of the rctrig signal 404 is limited by the inverter stage (transistors M2 and M3). Thus, the single-stage ESD protection circuit 400 might not supply a large enough current to the NMOS clamp (transistor M1) for effective ESD protection.

Figure 5:
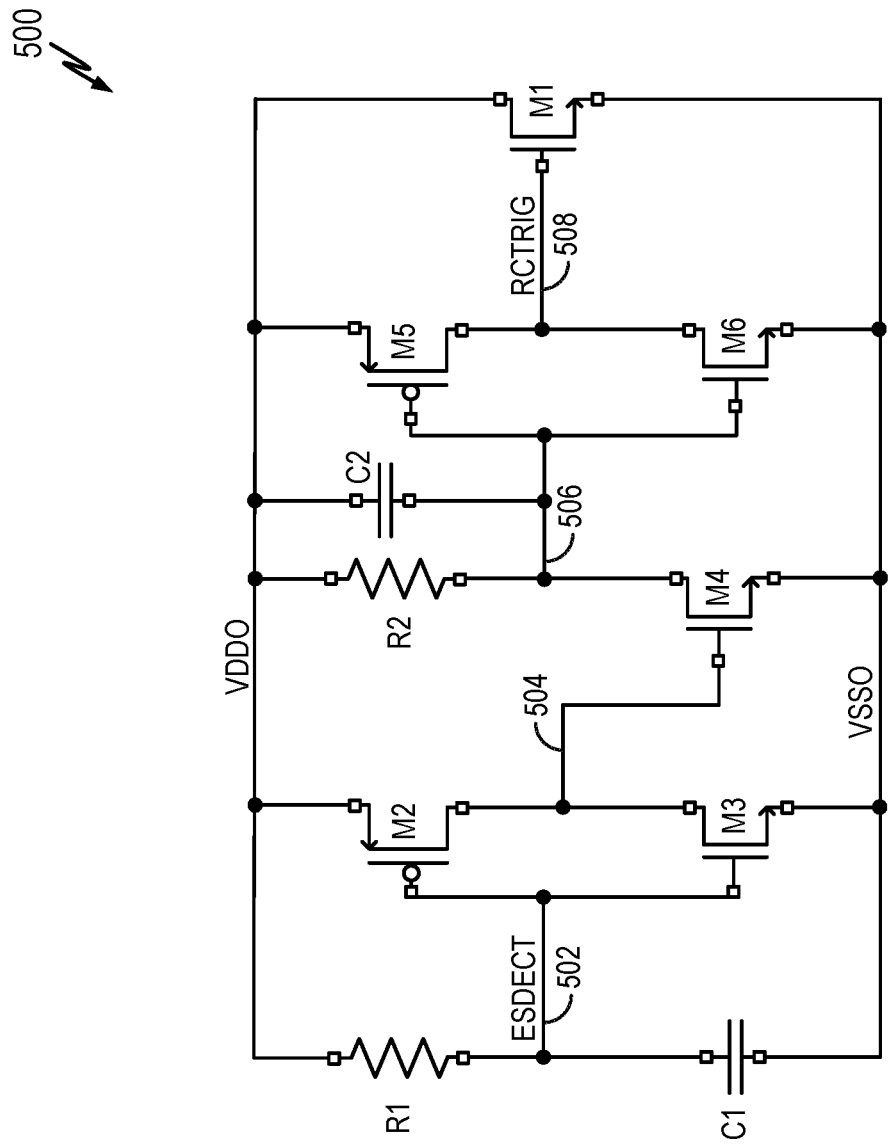
FIG. 5 illustrates another example ESD protection circuit.

FIG. 5 illustrates an example of a two-stage ESD protection circuit 500 that support hot insertion. An ESD event is detected through the first RC stage (resistor R1 and capacitor C1). The esdect signal 502 thus remains low for a period of time, thereby turning on the transistor M2. This causes the signal at the node 504 to go high, turning on the transistor M4. This, in turn, causes the signal at the node 506 to go low for a period of time (as controlled by the second RC stage including the resistor R2 and the capacitor C2) which turns on the transistor M5, pulling up the rctrig signal 508 and turning-on the NMOS clamp (transistor M1).

The on-time of the transistor M1 is thus determined by the second RC stage (e.g., the transistor M5 turns off once the node 506 reaches the device threshold voltage $V_t$ due to the action of the capacitor C2). This makes the circuit independent of the supply ramp rate during normal operation. As such, the two-stage ESD protection circuit 500 can effectively support hot insertion.

However, similar to the single-stage ESD protection circuit 400, the gain of the rctrig signal 508 is limited by inverter stage (transistors M5 and M6 in FIG. 5). Thus, the two-stage ESD protection circuit 500 might not supply a large enough current to the NMOS clamp (transistor M1) for effective ESD protection.

In addition, since the two-stage ESD protection circuit 500 has multiple stages, it takes a relatively long time to turn on the transistor M1 after an ESD event is detected. This can result in a large initial voltage being built up across the transistor M1 until it turns on. As a result, devices that use the two-stage ESD protection circuit 500 may be more prone to failure or damage.

The devices (e.g., NMOS clamps) used for ESD protection are required to carry a relatively large current within a certain period of time and are, therefore, sized to work within the specified boundary of device reliability and EOS limits. The size of these devices are also based on level of protection required. For example, NMOS clamps may need to be relatively large to withstand ESD stress (e.g., for up to 4 KV HBM protection the devices are enabled to carry 2.6 A of ESD current). Consequently, NMOS clamps could have a size on the order of 1500 to 2800 microns or larger. Due to the above issues, ESD protection circuitry may take up a relatively large area (e.g., 10%-20%) of an integrated circuit chip (or other circuit).

An ESD event is detected through the time constant associated with the supply rail, the RC time constant of the clamp trigger circuit is chosen to be much lower than the fastest supply ramp rate of supply. Failing to do so results in false triggering of the NMOS clamp which could make it impossible to power-on the chip. Consequently, the trigger circuit for the clamp needs to be fast enough to turn-on the NMOS clamp, while still meeting device reliability and electrical over-stress (EOS) limits.

Also, to enable ESD charges to follow the intended path, the overall parasitic resistance is minimized in layout. The path resistance from clamp to clamp is typically targeted to approximately 0.5 Ohms.

Moreover, conventional ESD designs may consume a relatively large amount of power. For example, the large NMOS clamp of an ESD protection circuit may have significant leakage when a chip is operating in its normal functional mode.

In view of the above, large ESD protection devices may adversely affect the overall leakage, power budget, and size budget of a design. Thus, there is a need to optimize the size of the ESD protection circuit on the silicon die to save cost and power, without sacrificing the clamping and hot-insertion performance.

Example ESD Protection Circuit

Figure 6:
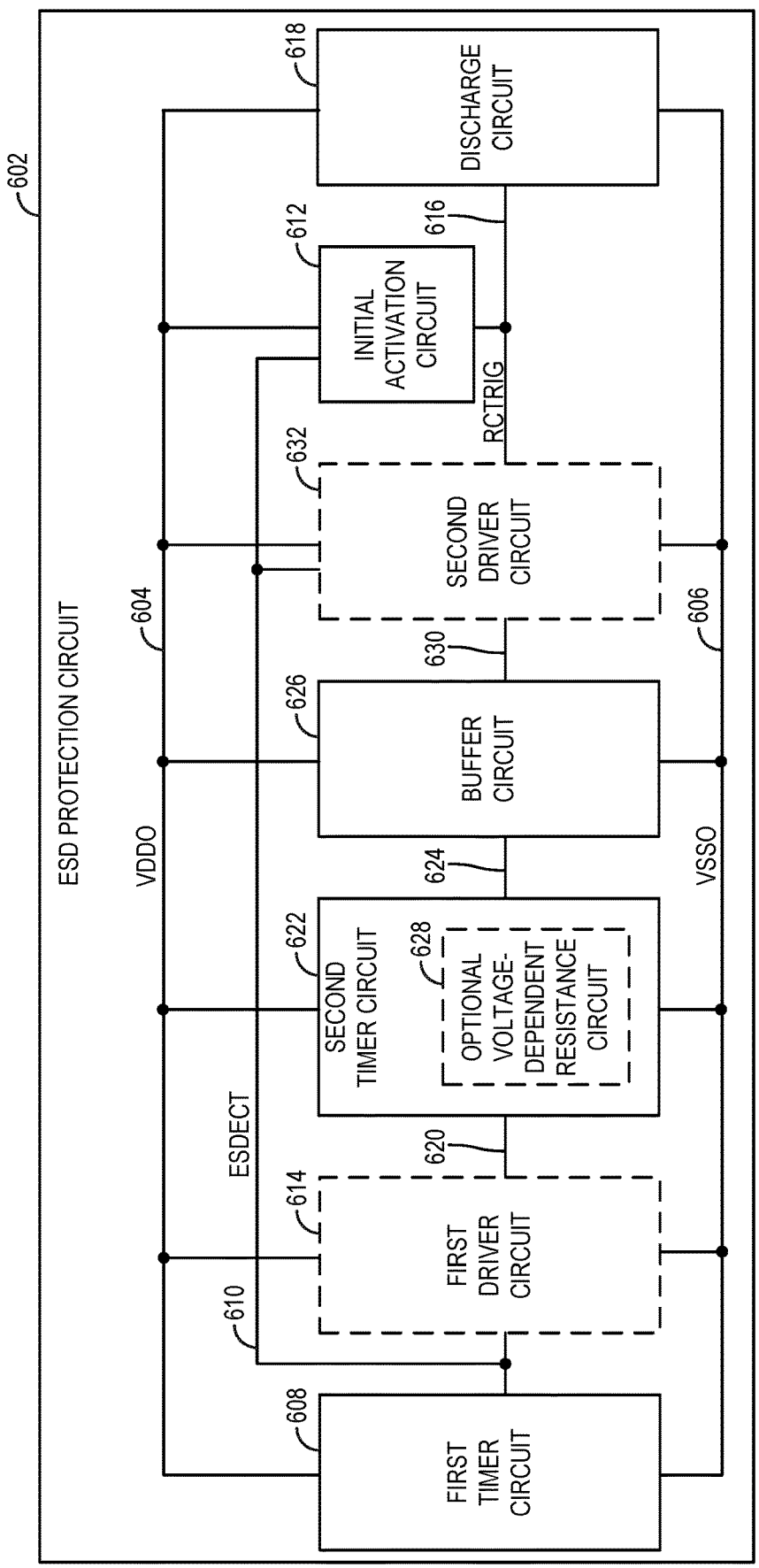
FIG. 6 illustrates a block diagram of an example ESD protection circuit in accordance with one or more aspects of the disclosure.

FIG. 6 illustrates a high-level example of an ESD protection circuit 602 in accordance with the teachings herein. The ESD protection circuit 602 provides clamping between a VDDO rail 604 and a VSSO rail 606. Clamping could be provided between other nodes in other implementations.

The ESD protection circuit 602 includes a first timer circuit 608 (e.g., an RC filter) that provides an esdect signal 610 to an initial activation circuit 612 and an optional first driver circuit 614. The initial activation circuit 612 drives the rctrig signal 616 during a first time window to quickly turn on the discharge circuit 618 (e.g., an NMOS clamp) during an ESD event. The optional first driver circuit 614 (which may be implemented as part of the first timer circuit 608) provides a trigger signal 620 based on the esdect signal 610 to the second timer circuit 622. The second timer circuit 622, in turn, provides a trigger signal 624 to the buffer circuit 626. In some implementations, the second timer circuit 622 may include a voltage-dependent resistance circuit 628 (discussed below). The buffer circuit 626 provides gain to generate a trigger signal 630 for activating the discharge circuit 618 during a second time window. The optional second driver circuit 632 (which may be implemented as part of the buffer circuit 626) drives the rctrig signal 616 based on the trigger signal 630.

The ESD protection circuit 602 employs a two-stage RC architecture similar to FIG. 5 to support hot insertion. The first timer circuit 608 (e.g., an RC stage including resistor R1 and capacitor C1) is used for detecting an ESD event. The second timer circuit (e.g., an RC stage including resistor R2 and capacitor C2) controls the amount of time that the discharge circuit 618 remains turned-on.

Advantageously, the gain of the rctrig signal 616 is increased through the use of the buffer circuit 626. For example, the buffer circuit 626 may increase the slew rate of the signal 624 output by the second timer circuit 622. For example, the signal 624 may have a signal transition slew rate on the order of hundreds of nanoseconds (ns), while the signal 630 output by the buffer circuit 626 may have much steeper signal transitions. This results in the discharge circuit 618 (e.g., an NMOS clamp) being driven more effectively (e.g., driven harder), which may enable use of a smaller NMOS clamp.

The buffer circuit 626 may slow down the timing of the rctrig signal 616, potentially making the protection circuit and other devices vulnerable to failure. To address this issue, a bypass path for the esdect signal 610 control the initial activation circuit 612 (e.g., during a first time window) to limit the initial voltage buildup across the discharge circuit 618. The bypass path is disabled (due to the capacitor C1 charging up, thereby turning off M7) by the time the main trigger circuit (e.g., the second timer circuit 622 and the buffer circuit 626) takes over the control of the discharge circuit 618 (e.g., during a second time window that starts before the first time window ends). For example, the initial activation circuit 612 might only be activated for 20 ns in an example implementation. However, by keeping the discharge circuit 618 activated longer through the use of multiple time windows, a smaller NMOS clamp transistor may be used, while discharging the same amount of current that a larger NMOS clamp transistor would discharge during a shorter activation period. Thus, a significant savings in silicon area (e.g., on the order of 30%) may be achieved.

As mentioned above, the second timer circuit 622 may include a voltage-dependent resistance circuit 628 (e.g., that kicks in at low voltage levels). In some aspects, the voltage-dependent resistance circuit 628 may be used to account for process, voltage, and temperature (PVT) variations. For example, the resistance of the voltage-dependent resistance circuit 628 may vary based on the voltage on VDDO 604. This may ensure that the desired turn-on window is achieved even for cases where the voltage on VDDO approaches the threshold voltage $V_t$ of the devices of the ESD protection circuit 602. In such a case, the output of the inverter-type circuit made up of transistors M10 and M11 may be decided by leakage current. Since the leakage current of the transistor M10 may be much higher than the leakage current of M11, this condition may result in the transistor M1 being turned off prematurely. The use of the voltage-dependent resistance circuit 628 slows down the charging of the capacitor C2, thereby mitigating this issue.

In an example implementation, the ESD protection circuit 602 may effectively support 4 KV with 500 ns supply power up support (hot insertion). Advantageously, this design may significantly mitigate the risk of failure due to initial charge buildup during an ESD event. With the above overview in mind, an example implementation of the ESD protection circuit 602 will be described with reference to FIG. 7.

Figure 7:
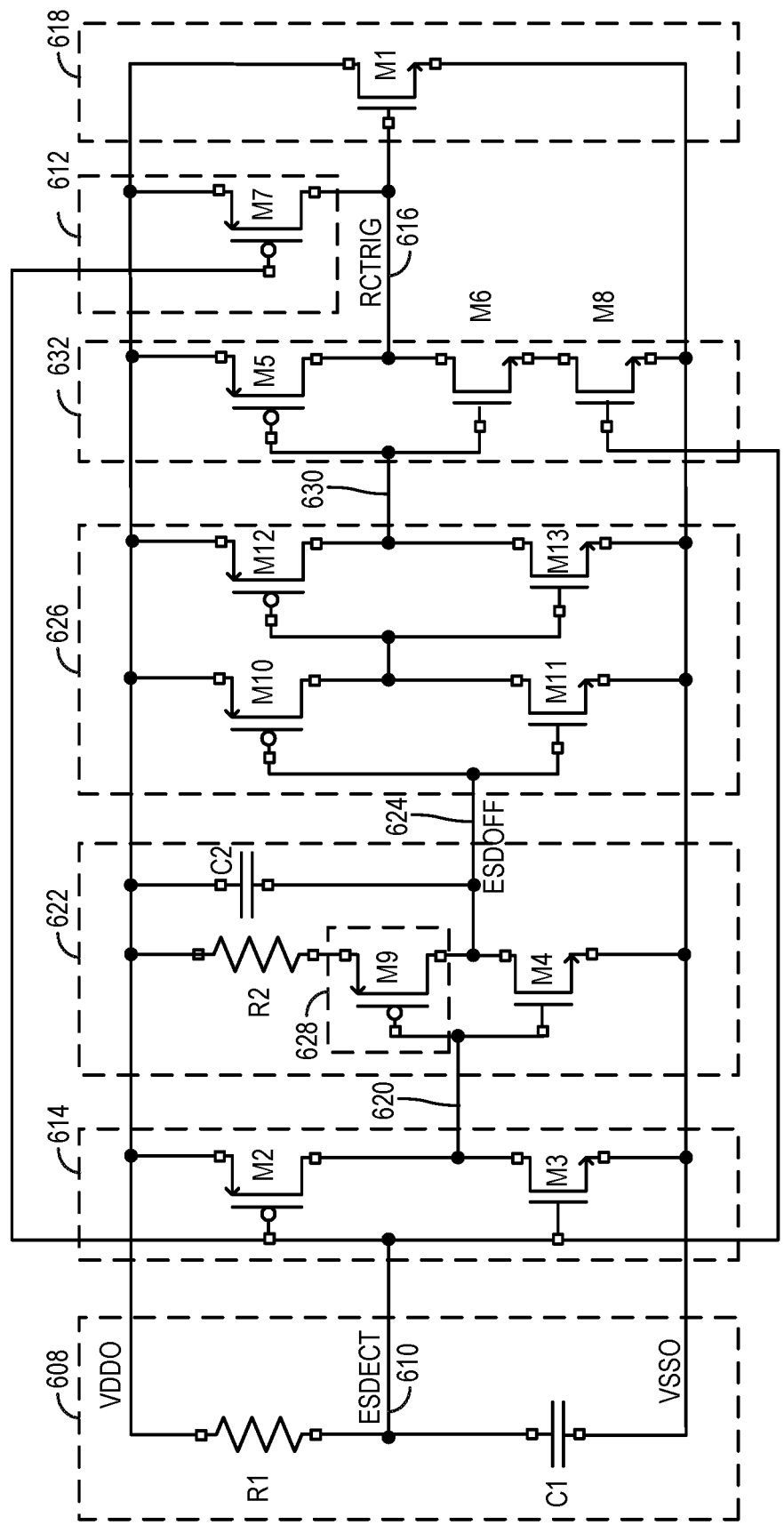
FIG. 7 illustrates a schematic diagram of an example ESD protection circuit in accordance with one or more aspects of the disclosure.

As shown in FIG. 7, the first timer circuit 608 may include an RC filter (e.g., resistor R1 and capacitor C1 with a time constant on the order of 200 ns) similar to the ESD detection RC filters discussed above. In addition, the first driver circuit 614 may include a transistor M2 and a transistor M3 (e.g., in an inverter-type configuration) similar to the ESD protection circuits discussed above. In practice, the transistors M2 and M3 might not be balanced (e.g., the transistor M3 may be much smaller than the transistor M2 to improve the drive of the transistor M2).

The second timer circuit 622 may include an RC filter (e.g., resistor R2 and capacitor C2 with a time constant on the order of microseconds) similar to the two-stage ESD detection circuit discussed above in FIG. 5. In the example of FIG. 7, however, the second timer circuit 622 may include a voltage-dependent resistance circuit 628 (NMOS transistor M9) in series with the resistor R2. As discussed herein, the resistance of the NMOS transistor M9 may vary according to the voltage across it. Since the resistor R2 may be relatively large (e.g., a hundred KΩ or more), the resistor R2 will dominate when VDDO is at a higher voltage level. When VDDO is at a lower voltage level (e.g., near $V_t$), however, the resistance of the transistor M9 is higher, thereby increasing the time constant of the RC filter which may serve to prevent false triggers by the buffer circuit 626 (e.g., transistors M10 and M11). In addition, the transistor M9 may serve to completely turn-on the transistor M10, thereby increasing the overdrive of the transistor M10.

In the example of FIG. 7, the buffer circuit 626 includes two inverter-type transistor configurations. In practice, the transistors of the buffer circuit 626 might not be balanced (e.g., the transistor M11 may be much smaller than the transistor M10 to improve the drive of the transistor M10). Other types of buffer circuits may be used in other implementations.

The second driver circuit 632 may include a transistor M5 and a transistor M6 (e.g., in an inverter-type configuration) similar to the two-stage ESD protection circuit of FIG. 5. In this case, however, a transistor M8 is added to cut off the transistor M6 when the initial activation circuit 612 is on.

As discussed above, the initial activation circuit 612 includes a PMOS transistor M7 that is turned on when the esdect signal 610 goes low. Thus, the discharge circuit 618 (an NMOS transistor M1 in this example) is turned on quickly once on ESD event occurs.

The delay imparted by the first driver circuit 614, the second timer circuit 622, the buffer circuit 626, and the second driver circuit 632 results in the transistor M5 driving the rctrig signal 616 low a specified period of time after the initial activation circuit 612 drives the esdect signal 610 low. Thus, once the initial activation circuit 612 stops driving the esdect signal 610 low (when the esdect signal 610 goes back high), the transistor M5 keeps driving the rctrig signal 616 low for a period of time (as controlled by the second timer circuit 622).

With the above in mind, additional details of the operations of the circuitry of FIG. 7 will now be described in more detail. The initial activation circuit 612 includes a transistor M7 that has a source terminal connected to the VDDO rail, a drain terminal connected to the rctrig signal 616, and a gate terminal connected to the esdect signal 610 (the detection voltage). The initial activation circuit 612 may be activated when the detection voltage causes the transistor M7 to be turned on, and may be deactivated when the detection voltage causes the transistor M7 to be turned off.

Prior to an ESD event, a level of the detection voltage generated between the VDDO rail and esdect 610 (or a voltage drop across the resistor R1) may be relatively small (i.e., below threshold voltages of the first and third PMOS transistors M2 and M7) such that transistor M7 is turned off. Hence, prior to an ESD event, the initial activation circuit 612 is not activating the discharge path. Also, with the detection voltage generated between the VDDO rail and esdect 610 being relatively small, the PMOS transistor M2 is also turned off. Depending on the voltage level at esdect 610, the NMOS transistor M3 and the NMOS transistor M8 may be either turned on or off. In either case, however, the level of the voltage at the signal 620 may be sufficiently low to cause the NMOS transistor M4 to be turned off. With the NMOS transistor M4 turned off, the level of the voltage at the esdoff signal 624 may be close enough to the level of the voltage on the VDDO rail such that the PMOS transistor M5 is turned off. Since both the PMOS transistors M5 and M7 are turned off prior to an ESD event, the level of the first activation voltage generated at the rctrig signal 616 may be sufficiently low to cause the NMOS transistor M1 to be turned off and in general, the discharge path to be deactivated.

When an ESD event initially occurs, an initial spike or rise in the ESD voltage on the VDDO rail may occur fast enough to cause the detection voltage between the VDDO rail and esdect 610 to be initially generated at a sufficiently large level (e.g., above a detection level) to cause the PMOS transistors M2 and M7 to turn on. In general, a transient voltage on the VDDO rail occurring fast enough to cause the PMOS transistors M2 and M7 to turn on may be synonymous with the transient voltage occurring within the first timing window. Also, the PMOS transistors M2 and M7 initially turning on may be synonymous with the first timing window initially opening.

After the PMOS transistors M2 and M7 initially turn on, the voltage at esdect 610 may begin to rise according to the resistance and capacitance values of the resistor R1 and the capacitor C1, respectively. As the voltage at esdect 610 continues to rise, the detection voltage between the VDDO rail and esdect 610 may continually decrease until the detection voltage reaches a sufficiently small level to cause the PMOS transistor M2 to turn off. The PMOS transistor M2 turning off may be synonymous with the first timing window closing.

When the transistor M7 turns on, the transistor M7 may pull up the first activation voltage at the rctrig signal 616 to a logic high level to cause the NMOS transistor M1 to turn on and begin discharging charge on the VDDO rail. In this way, the discharge path is activated when the first timing window opens. Subsequently, when the first timing window closes, the transistor M7 may turn off, and in turn, the discharge path may no longer be activated based on the initial activation circuit 612. Since the turning on and off of the NMOS transistor M6 is determined by the first timing window, then not only is the first timing window used to detect an ESD event, but it is also used to set a time duration during which the initial activation circuit 612 activates the discharge path. Also, any delay between the initial rise or spike of the ESD voltage and the activation of the discharge path 412 (i.e., the turning on of the transistor M7 and, in turn, the NMOS transistor M1) may be relatively short such that the discharge path may begin suppressing the ESD voltage before it can reach an undesirably high level.

When the first timing window is open and the PMOS transistor M2 is turned on, the PMOS transistor M2 may pull up the second activation voltage generated at the signal 620 to a level that turns on the NMOS transistor M4. When the ESD event initially occurs, an initial rise or spike in the ESD voltage level may cause an initial rise in the voltage level at the esdoff signal 624 via the resistor R2. However, the PMOS transistor M2 may turn on and pull up the level of the first activation voltage at the signal 620 shortly thereafter, which may cause the NMOS transistor M4 to turn on and pull down the level of the voltage at the esdoff signal 624 down to the ground reference voltage level (e.g., 0 V).

Second activation circuitry (including the second timer circuit 622) may be considered to be initially activated when the NMOS transistor M4 is turned on. Accordingly, the first timer circuit 608 may activate the second activation circuitry when the PMOS transistor M2 pulls up the signal 620 to a level that turns on the NMOS transistor M4.

When the NMOS transistor M4 is turned on and the voltage at the esdoff signal 624 is pulled down to the ground reference voltage level, a voltage difference between the VDDO rail and the esdoff signal 624 may be sufficiently large to turn on the PMOS transistor M5. When the first timing window closes and the PMOS transistors M2 and M7 turn off, the resulting level of the signal 620 may cause the NMOS transistor M4 to also turn off. With the NMOS transistor M4 turned off, a level of the voltage at the esdoff signal 624 may begin to rise toward the voltage level on the VDDO rail via the parallel connection of the resistor R2 and the capacitor C2. The voltage of the esdoff signal 624 may continue to rise until the voltage difference between the voltage on the VDDO rail and the voltage of the esdoff signal 624 is sufficiently small to cause the PMOS transistor M5 to turn off.

The PMOS transistor M5 initially turning on may be synonymous with the second timing window initially opening, and the PMOS transistor M5 turning off may be synonymous with the second timing window closing. How fast the level of the voltage at the esdoff signal 624 rises (and how fast the second timing window closes when the NMOS transistor M4 turns off) may depend on the resistance of the resistor R2 and the capacitance of the capacitor C2. As such, the duration of the second timing window may depend at least in part on the resistance of the resistor R2 and the capacitance of the capacitor C2.

When the second timing window opens and the PMOS transistor M5 is turned on, the PMOS transistor M5 may pull up the voltage of the rctrig signal 616 to a level that turns on the NMOS transistor M1. However, due to the delay between the start of the ESD event and when the PMOS transistor M5 turns on, the transistor M7, with its gate being directly connected to esdect 610, may have already turned on and started activating the discharge path by the time that the PMOS transistor M5 turns on. Yet, the resistance of the resistor R2 and the capacitance of the capacitor C2 may be set to respective values to cause the second timing window to be open for a sufficient duration after the first timing window closes. In this way, after the first timing window closes and the initial activation circuit 612 is deactivated, the discharge path is still activated to suppress the ESD voltage, should the ESD event still be occurring when the first timing window closes. Subsequently, when the second timing window closes, the PMOS transistor M5 may turn off. Since the first window may be closed and the transistor M7 may be turned off when the second timing window closes, then both the second activation circuitry may be deactivated with the second timing window closes. As such, when the second timing window closes and the PMOS transistor M5 turns off, the NMOS transistor M1 may turn off, deactivating the discharge path.

As previously described, when an ESD event occurs, there may be an initial rise of spike in the ESD voltage level occurring at the esdoff signal 624 shortly before the NMOS transistor M4 turns on and starts pulling down the voltage of the esdoff signal 624. The NMOS transistor M6, in response to this initial increase in voltage, may want to turn on and start pulling down the level of the rctrig signal 616. However, when the ESD event first occurs, the transistor M7 turns on to pull up the level of the rctrig signal 616 so that the NMOS transistor M1 turns on and starts discharging the charge on the VDDO rail. Turning on the NMOS transistor M6 may undesirably cause contention at the rctrig signal 616 and hinder the ability of the transistor M7 to activate the discharge path right when the ESD detection circuitry 408 detects the ESD event. However, by connecting the gate terminal of the NMOS transistor M8 to esdect 610, the initial level of the detection voltage when an ESD event occurs may turn off the NMOS transistor M8, which in turn may prevent the NMOS transistor M6 from pulling down the level of the rctrig signal 616 despite the initial spike or rise at the esdoff signal 624 when the ESD event starts. As such, the NMOS transistor M8, by being turned off when an ESD event occurs, may allow the transistor M7 to turn on to activate the discharge path without being affected by contention at the rctrig signal 616 due to the NMOS transistor M6 being turned on.

Example Performance Graphs

Figure 8:
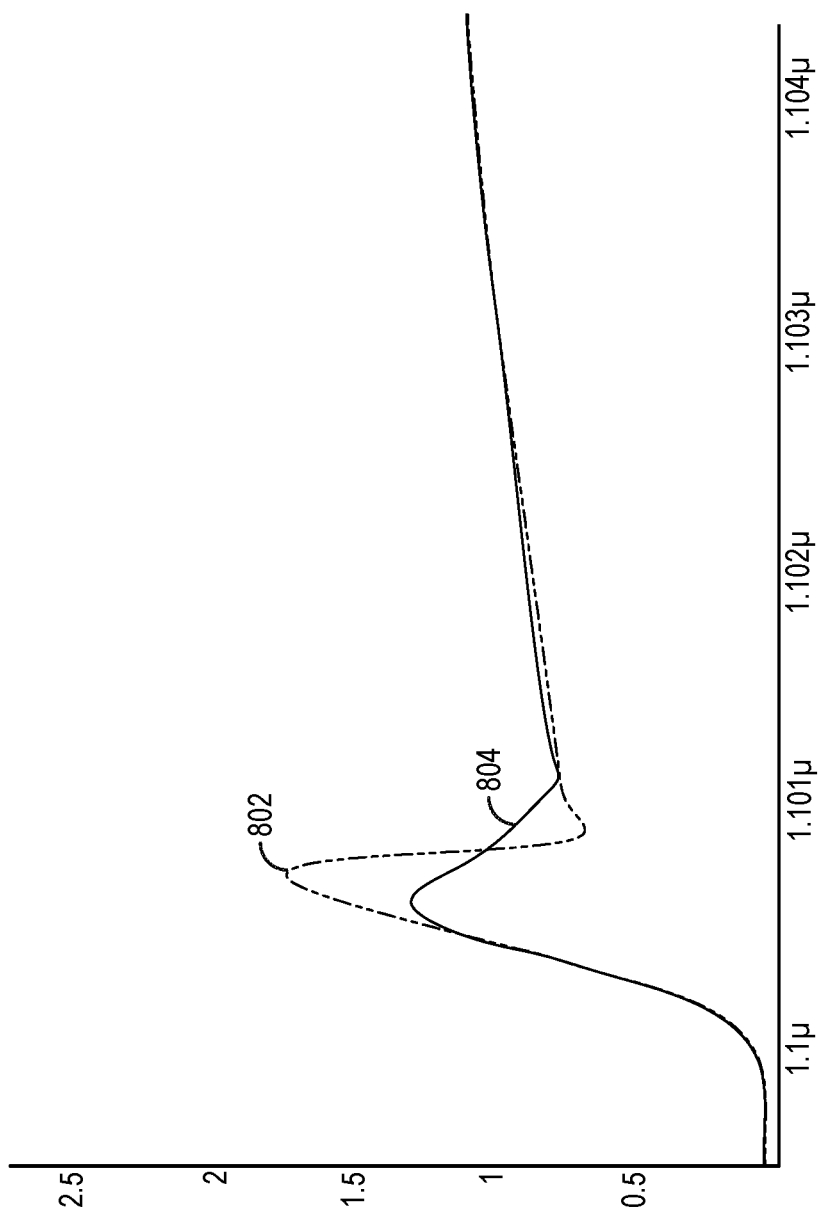
FIG. 8 illustrates an example of initial charge buildups for ESD protection circuits.
Figure 9:
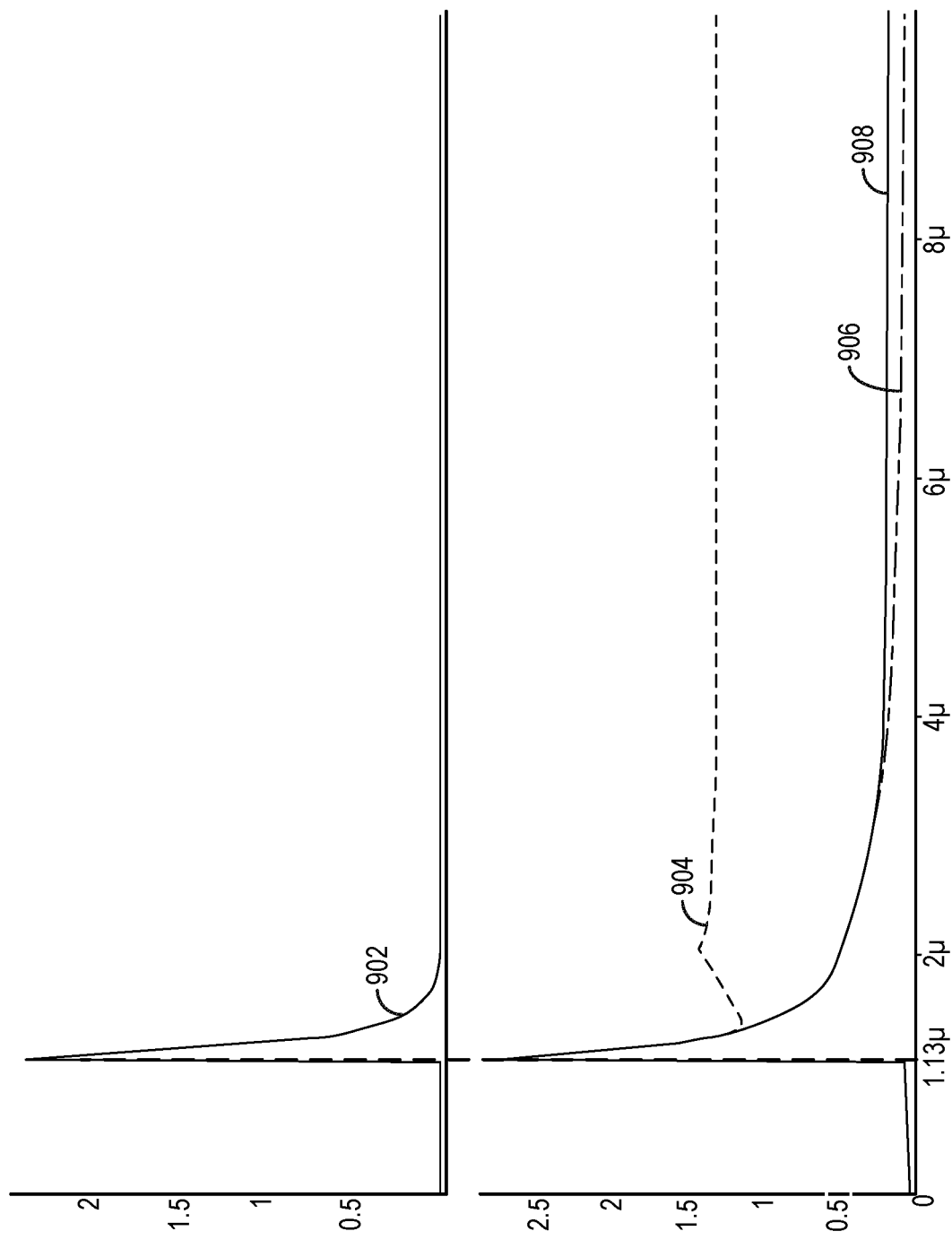
FIG. 9 illustrates an example of voltage profiles for ESD protection circuits.
Figure 10:
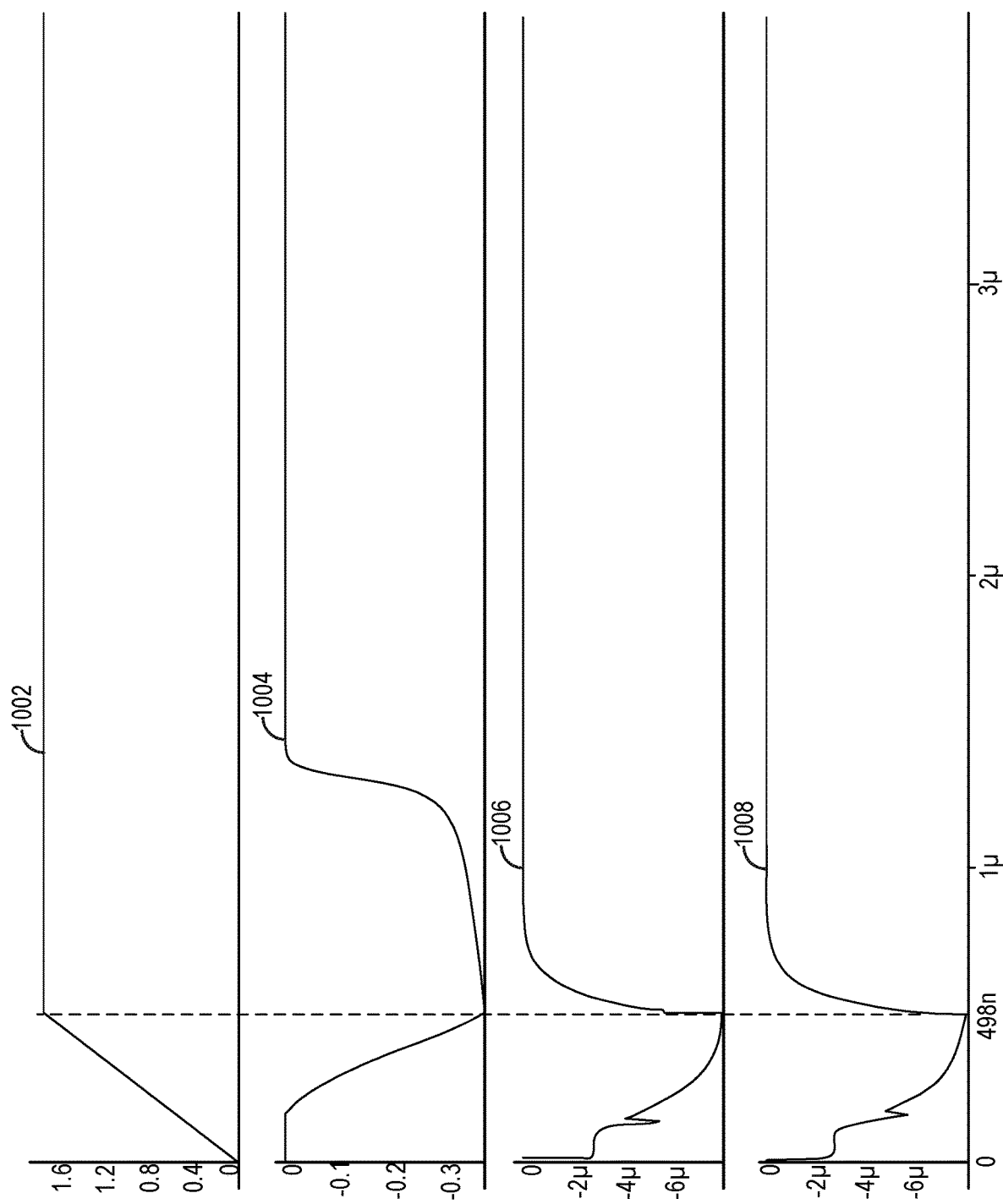
FIG. 10 illustrates an example of in-rush currents for ESD protection circuits.

FIGS. 8-11 illustrates examples of simulations that compare the performance of the ESD protection circuit of FIGS. 6 and 7 with the single-stage and two-stage ESD protection circuits of FIGS. 4 and 5. FIG. 8 illustrates that the initial charge buildup 802 of the two-stage ESD protection circuits of FIG. 5 is higher than the initial charge buildup 804 of the ESD protection circuit of FIGS. 6 and 7. FIG. 9 illustrates, responsive to an ESD event 902, the voltage profile 904 for the single-stage ESD protection circuit of FIG. 4, the voltage profile 906 for the two-stage ESD protection circuit of FIG. 5, and the voltage profile 908 for the ESD protection circuit of FIGS. 6 and 7. FIG. 10 illustrates, responsive to a power ramp-up of 500 ns 1002, the in-rush current 1004 for the single-stage ESD protection circuit of FIG. 4, the in-rush current 1006 for the two-stage ESD protection circuit of FIG. 5, and the in-rush current 1008 for the ESD protection circuit of FIGS. 6 and 7.

As discussed above, the duration of the ESD trigger is determined by the value of resistor R2 the capacitor C2. However, during an ESD event, the supply VDDO discharges. Due to the non-ideal nature of the capacitor C2 and dependency on subthreshold current (e.g., as discussed above), it might not be possible to control the time window of the ESD trigger across PVT (e.g., the charging of esdoff may see large variation across PVT).

Figure 11:
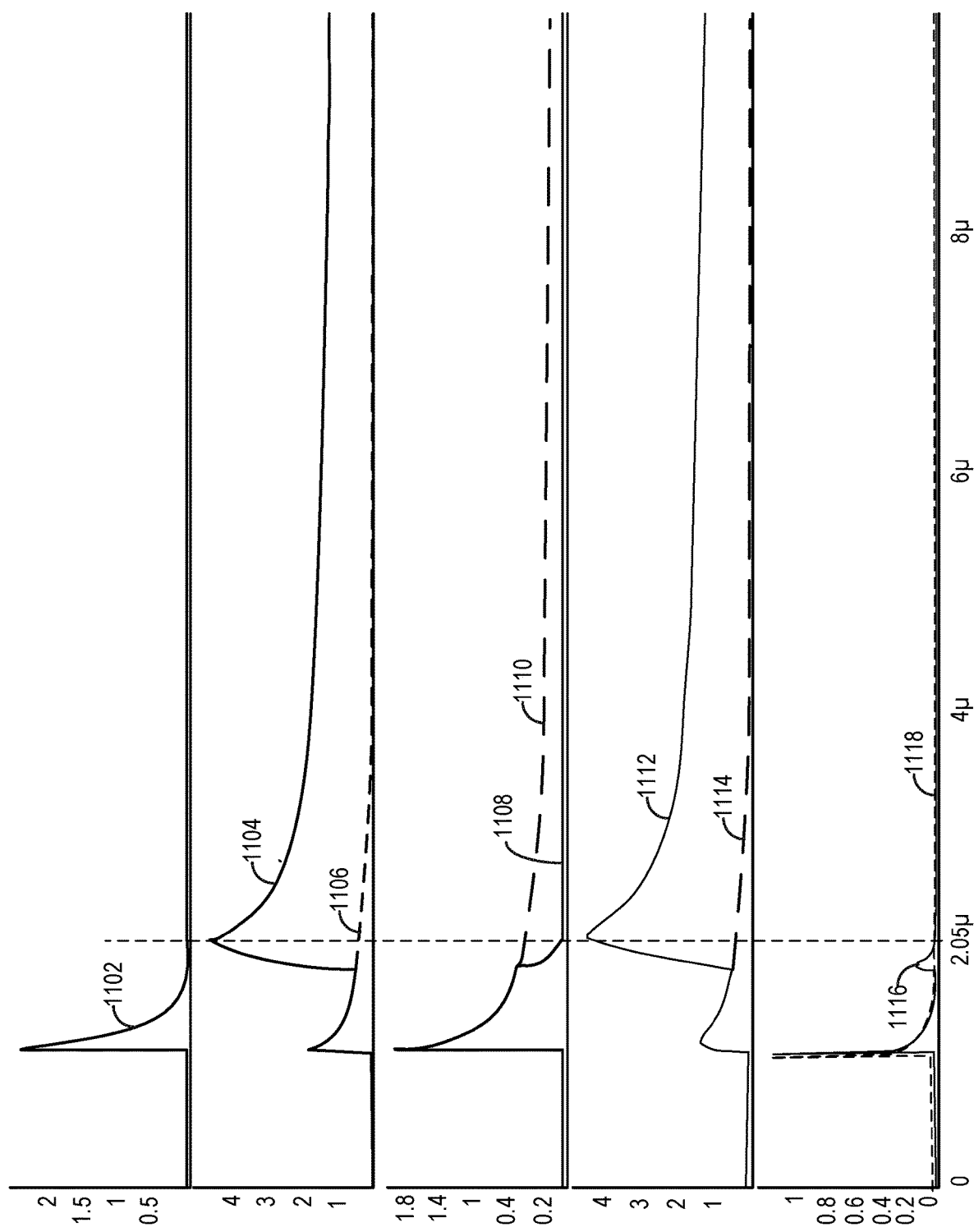
FIG. 11 illustrates an example of circuit performance associated with a voltage-dependent resistance circuit for an RC filter in accordance with one or more aspects of the disclosure.

Referring to FIG. 11, despite the resistor R2 and the capacitor C2 values chosen for a time constant of 1 microsecond, the effective ESD window for the graph 1104 is reduce to approximately 0.7 microseconds as VDDO goes below the threshold voltage $V_t$ of the device. In this case, the M1 clamp turns off before the desired time, resulting in voltage build-up again as shown in the graph 1104. This poses "risk" of device failure.

One way to solve this problem is to have much larger value of R2 and/or C2. But this comes at a cost of additional silicon area.

In accordance with the teachings herein, the transistor M9 is used to improve the charging ability of the transistor C2. The impedance of the RC timer is thus now based on the voltage at VDDO. Until VDDO discharges to very low level (e.g., $V_t$), the charging of C2 is dominated by R2. Near $V_t$, the charging of C2 is scaled by the resistance of the transistor M9. Thus, the addition of M9 keeps the ESD trigger window intact across PVT.

FIG. 11 illustrates, responsive to an ESD event 1102, performance charts 1104, 1108, 1112, and 1116 without the transistor M9 and performance charts 1106, 1110, 1114, and 1118 with the transistor M9. Of note, in the clamp voltage graph 1104 without the transistor M9, there is a large voltage across the clamp at time 2.05 microsecond due to a mistrigger. In contrast, in the clamp voltage graph 1106 with the transistor M9, the voltage across the clamp does not ramp back up at time 2.05 microsecond.

Example Process

Figure 12:
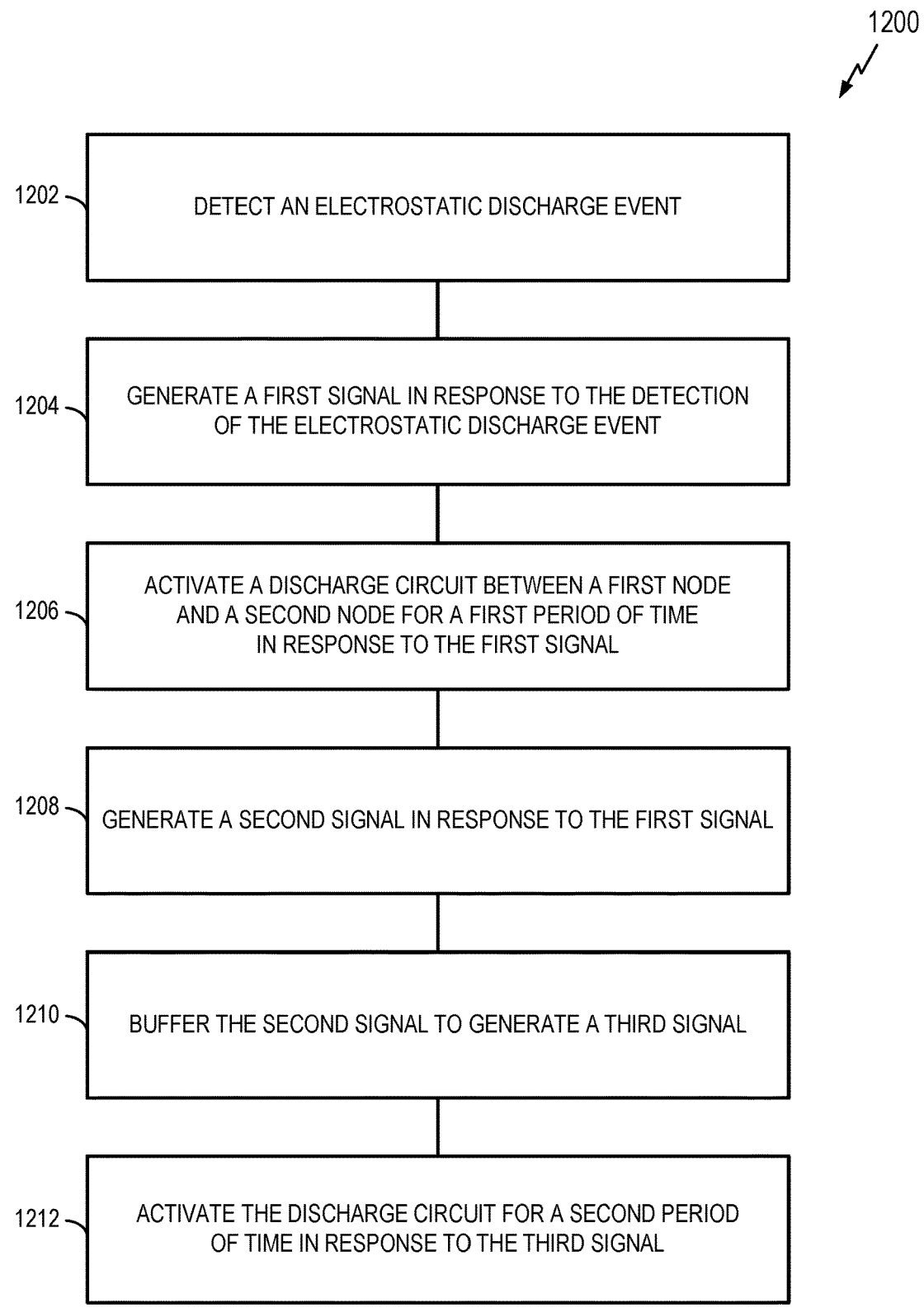
FIG. 12 illustrates an example ESD protection process in accordance with one or more aspects of the disclosure.

FIG. 12 illustrates a process 1200 for communication in accordance with some aspects of the disclosure. The process 1200 may take place within an ESD protection circuit as described herein. Of course, in various aspects within the scope of the disclosure, the process 1200 may be implemented by any suitable apparatus capable of supporting ESD protection-related operations.

At block 1202, an apparatus (e.g., an ESD protection circuit) detects an electrostatic discharge event.

At block 1204, the apparatus generates a first signal in response to the detection of the electrostatic discharge event.

At block 1206, the apparatus activates a discharge circuit between a first node and a second node for a first period of time in response to the first signal.

At block 1208, the apparatus generates a second signal in response to the first signal. In some aspects, the generation of the second signal may include adjusting a resistive-capacitive time constant of a resistive-capacitive filter based on a voltage on the first node.

At block 1210, the apparatus buffers the second signal to generate a third signal. In some aspects, the second signal may have a first slew rate, and the third signal may have a second slew rate that is faster than the first slew rate.

At block 1212, the apparatus activates the discharge circuit for a second period of time in response to the third signal. In some aspects, the first time period may commence before the second time period commences, the second time period may end after the first time period ends, and the first time period and the second time period may partially overlap.

In some aspects, a process in accordance with the teachings herein may include any combination of the above operations.

Example Memory System

The teachings herein may be used in a memory system that includes NAND memory technology. A NAND device may be referred to herein as a NAND Flash memory, a NAND memory device, a NAND flash, or a NAND. Generally speaking, a NAND device is a non-volatile memory having high storage density, fast access time, low power requirements in operation and advantageous shock resistance, compared to more conventional memory platforms. Raw NAND devices may be equipped (e.g., configured) with a serial interface such as Open NAND Flash Interface (ONFi), Common Flash Memory Interface (CFI), and the like. NAND devices may be configured as discrete memory chips or packaged with a controller to form a secure digital (SD) memory card, Multi Media Card (MMC), or a solid state disk. A NAND device may be configured with a single flash die, or a plurality of dies. In addition to memory cells, a NAND device may include other components, such as control/address logic components, I/O components, and data register components. It should be appreciated that the teachings herein are also applicable to other forms of memory (e.g., NVM other than NAND devices).

Figure 13:
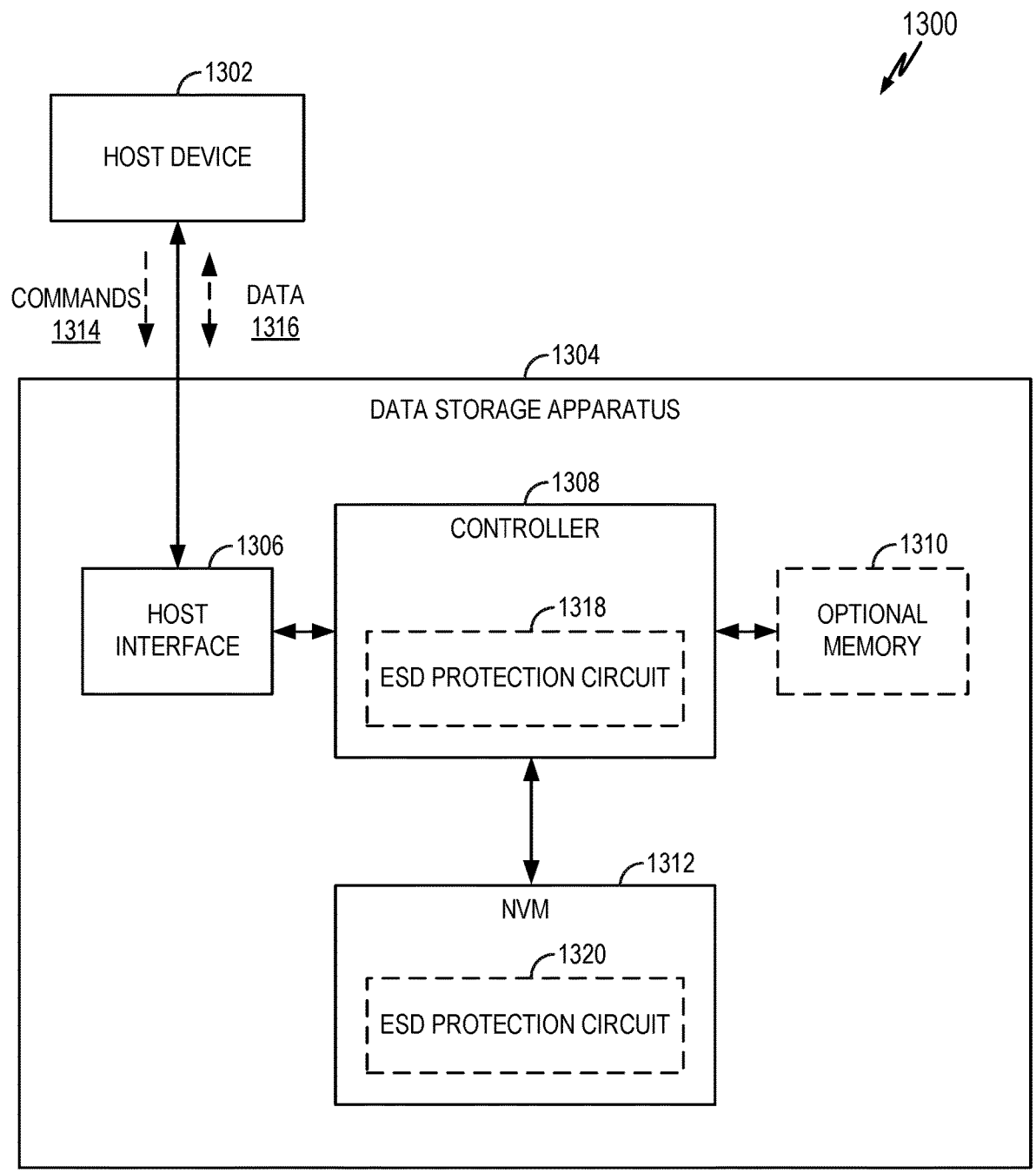
FIG. 13 illustrates an example memory system including a solid state data storage device (e.g., a solid state drive) configured in accordance with one or more aspects of the disclosure.

FIG. 13 illustrates an embodiment of a memory system 1300 that includes a host device 1302 and data storage apparatus 1304 communicatively coupled to the host device 1302. In some embodiments, the data storage apparatus 1304 may be a solid state device (SSD). In some embodiments, an SSD may be a solid state drive.

The host device (e.g., a host computer) 1302 provides commands to the data storage apparatus 1304 for transferring data between the host device 1302 and the data storage apparatus 1304. For example, the host device 1302 may provide a write command to the data storage apparatus 1304 for writing data to the data storage apparatus 1304 or a read command to the data storage apparatus 1304 for reading data from the data storage apparatus 1304. The host device 1302 may be any system or device having a need for data storage or retrieval and a compatible interface for communicating with the data storage apparatus 1304. For example, the host device 1302 may a computing device, a personal computer, a portable computer, or workstation, a server, a personal digital assistant, a digital camera, a digital phone, or the like.

The data storage apparatus 1304 includes a host interface 1306, a controller 1308, an optional memory 1310, and a non-volatile memory (NVM) 1312. The host interface 1306 is coupled to the controller 1308 and facilitates communication between the host device 1302 and the controller 1308. Additionally, the controller 1308 is coupled to the memory 1310 and the NVM 1312. The host interface 1306 may be any type of communication interface, such as an Integrated Drive Electronics (IDE) interface, a Universal Serial Bus (USB) interface, a Serial Peripheral (SP) interface, an Advanced Technology Attachment (ATA) interface, a Small Computer System Interface (SCSI), an IEEE 1394 (Firewire) interface, or the like. In some embodiments, the host device 1302 includes the data storage apparatus 1304 (e.g., the host device 1302 and the data storage apparatus 1304 are implemented as a single component). In other embodiments, the data storage apparatus 1304 is remote with respect to the host device 1302 or is contained in a remote computing system coupled in communication with the host device 1302. For example, the host device 1302 may communicate with the data storage apparatus 1304 through a wireless communication link.

The controller 1308 controls operation of the data storage apparatus 1304. In various embodiments, the controller 1308 receives commands 1314 from the host device 1302 through the host interface 1306 and performs the commands to transfer data 1316 between the host device 1302 and the NVM 1312. In addition, the controller 1308 performs internal operations such as garbage collection operations, data integrity operations, and wear leveling operations. The controller 1308 may include any type of processing device, such as a microprocessor, a microcontroller, an embedded controller, a logic circuit, software, firmware, or the like, for controlling operation of the data storage apparatus 1304.

In some embodiments, some or all of the functions described herein as being performed by the controller 1308 may instead be performed by another element of the data storage apparatus 1304. For example, the data storage apparatus 1304 may include a microprocessor, a microcontroller, an embedded controller, a logic circuit, software, firmware, or any kind of processing device, for performing one or more of the functions described herein as being performed by the controller 1308. In some embodiments, one or more of the functions described herein as being performed by the controller 1308 are instead performed by the host device 1302. In some embodiments, some or all of the functions described herein as being performed by the controller 1308 may instead be performed by another element such as a controller in a hybrid drive including both non-volatile memory elements and magnetic storage elements.

The memory 1310 may be any memory, computing device, or system capable of storing data. For example, the memory 1310 may be a random-access memory (RAM), a dynamic random-access memory (DRAM), a static random-access memory (SRAM), a synchronous dynamic random-access memory (SDRAM), a flash storage, an erasable programmable read-only-memory (EPROM), an electrically erasable programmable read-only-memory (EEPROM), or the like. In various embodiments, the controller 1308 uses the memory 1310, or a portion thereof, to store data during the transfer of data between the host device 1302 and the NVM 1312. For example, the memory 1310 or a portion of the memory 1310 may be a cache memory.

The teachings herein may be used to protect any of the circuitry of the data storage apparatus 1304. In general, ESD protection as taught herein may be used to ensure that an ESD event is well controlled in the face of any handling of the corresponding packaging/packaged part. For example, ESD protection may be used for the data storage apparatus 1304 and/or any component of the data storage apparatus 1304 that has external connectivity. Several specific examples follow.

In some embodiments (e.g., in cases where the controller 1308 is an integrated circuit or other circuitry that has external connectivity), the controller 1308 includes an ESD protection circuit 1318. For example, ESD protection may be provided for one or more of external I/O pads or other nodes or signal paths of the controller 1308.

In some embodiments (e.g., in cases where the NVM 1312 is an integrated circuit or other circuitry that has external connectivity), the NVM 1312 includes an ESD protection circuit 1320. For example, ESD protection may be provided for one or more of external I/O pads or other nodes or signal paths of the NVM 1312.

Example SSD

Figure 14:
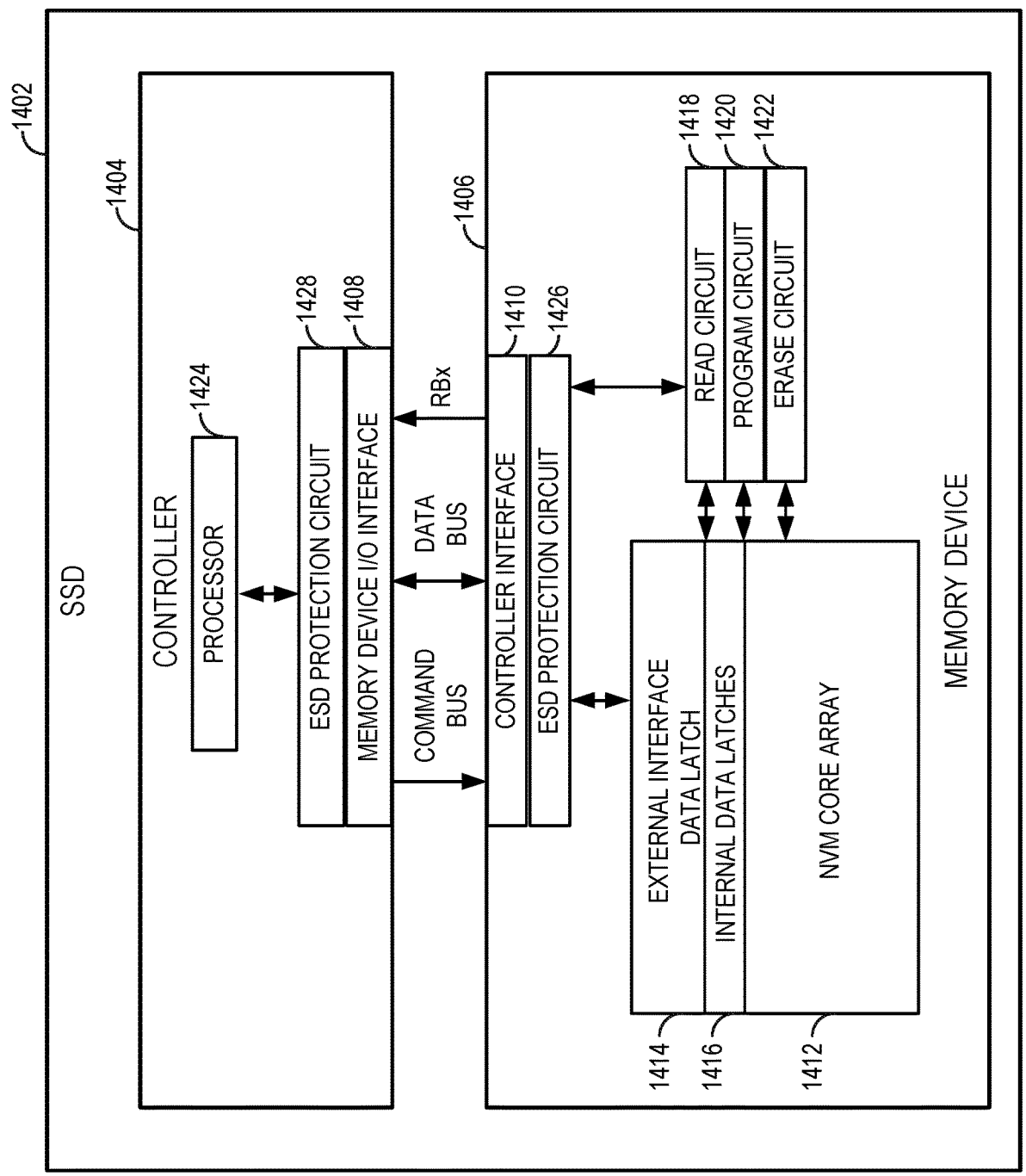
FIG. 14 illustrates an example SSD configured in accordance with one or more aspects of the disclosure.

FIG. 14 illustrates an embodiment of an SSD 1402 that may use ESD protection as taught herein. The SSD 1402 includes a controller 1404 that writes data to and reads data from a memory device 1406 (e.g., an NVM), and performs other associated data storage operations.

The controller 1404 and the memory device 1406 communicate with one another via corresponding interfaces. The controller 1404 includes a memory device input/output (I/O) interface 1408 (i.e., an interface for communicating with the memory device 1406) for sending commands from a processor 1424 to the memory device 1406 (e.g., via a command bus), sending data to and receiving data from the memory device 1406 (e.g., via a data bus), and for sending and receiving other signaling as applicable (e.g., a read/busy indication (RBx) generated by the memory device 1406). Similarly, the memory device 1406 includes a controller interface 1410 (i.e., an interface for communicating with the controller 1404) for receiving commands from the controller 1404 (e.g., via a command bus), sending data to and receiving data from the controller 1404 (e.g., via a data bus), and for sending and receiving other signaling as applicable (e.g., RBx).

The memory device 1406 includes an NVM core array 1412 for storing data, an external interface data latch 1414 for outputting stored data to and receiving data to be stored from the controller interface 1410, and a set of internal data latches 1416 for storing operational data that is used by the memory device 1406. The memory device 1406 also includes a read circuit 1418 for reading data from the multi-tier NVM core array 1412, a program circuit 1420 for writing data to the multi-tier NVM core array 1412, and an erase circuit 1422 for erasing data in the multi-tier NVM core array 1412.

The memory device 1406 may include an ESD protection circuit 1426. For example, ESD protection may be provided for one or more pads and/or signal paths of the controller interface 1410. ESD protection may be provided for other pads and/or signal paths of the memory device 1406.

The controller 1404 may include an ESD protection circuit 1428. For example, ESD protection may be provided for one or more pads and/or signal paths of the memory device I/O interface 1408. ESD protection may be provided for other pads and/or signal paths of the controller 1404.

Other Aspects

The examples set forth herein are provided to illustrate certain concepts of the disclosure. The apparatuses, devices, or components illustrated above may be configured to perform one or more of the methods, features, or steps described herein. Those of ordinary skill in the art will comprehend that these are merely illustrative in nature, and other examples may fall within the scope of the disclosure and the appended claims. Based on the teachings herein those skilled in the art should appreciate that an aspect disclosed herein may be implemented independently of any other aspects and that two or more of these aspects may be combined in various ways. For example, an apparatus may be implemented or a method may be practiced using any number of the aspects set forth herein. In addition, such an apparatus may be implemented or such a method may be practiced using other structure, functionality, or structure and functionality in addition to or other than one or more of the aspects set forth herein.

Aspects of the present disclosure have been described above with reference to schematic flowchart diagrams and/or schematic block diagrams of methods, apparatuses, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks.

The subject matter described herein may be implemented in hardware, software, firmware, or any combination thereof. As such, the terms "function," "module," and the like as used herein may refer to hardware, which may also include software and/or firmware components, for implementing the feature being described. In one example implementation, the subject matter described herein may be implemented using a computer readable medium having stored thereon computer executable instructions that when executed by a computer (e.g., a processor) control the computer to perform the functionality described herein. Examples of computer readable media suitable for implementing the subject matter described herein include non-transitory computer-readable media, such as disk memory devices, chip memory devices, programmable logic devices, and application specific integrated circuits. In addition, a computer readable medium that implements the subject matter described herein may be located on a single device or computing platform or may be distributed across multiple devices or computing platforms.

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures. Although various arrow types and line types may be employed in the flowchart and/or block diagrams, they are understood not to limit the scope of the corresponding embodiments. For instance, an arrow may indicate a waiting or monitoring period of unspecified duration between enumerated steps of the depicted embodiment.

The various features and processes described above may be used independently of one another, or may be combined in various ways. All possible combinations and sub-combinations are intended to fall within the scope of this disclosure. In addition, certain method, event, state or process blocks may be omitted in some implementations. The methods and processes described herein are also not limited to any particular sequence, and the blocks or states relating thereto can be performed in other sequences that are appropriate. For example, described tasks or events may be performed in an order other than that specifically disclosed, or multiple may be combined in a single block or state. The example tasks or events may be performed in serial, in parallel, or in some other suitable manner Tasks or events may be added to or removed from the disclosed example embodiments. The example systems and components described herein may be configured differently than described. For example, elements may be added to, removed from, or rearranged compared to the disclosed example embodiments.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The word "exemplary" is used herein to mean "serving as an example, instance, or illustration." Any aspect described herein as "exemplary" is not necessarily to be construed as preferred or advantageous over other aspects. Likewise, the term "aspects" does not require that all aspects include the discussed feature, advantage or mode of operation.

While the above descriptions contain many specific embodiments of the invention, these should not be construed as limitations on the scope of the invention, but rather as examples of specific embodiments thereof. Accordingly, the scope of the invention should be determined not by the embodiments illustrated, but by the appended claims and their equivalents. Moreover, reference throughout this specification to "one embodiment," "an embodiment," or similar language means that a particular feature, structure, or characteristic described in connection with the embodiment is included in at least one embodiment of the present disclosure. Thus, appearances of the phrases "in one embodiment," "in an embodiment," and similar language throughout this specification may, but do not necessarily, all refer to the same embodiment, but mean "one or more but not all embodiments" unless expressly specified otherwise.

The terminology used herein is for the purpose of describing particular aspects only and is not intended to be limiting of the aspects. As used herein, the singular forms "a," "an" and "the" are intended to include the plural forms as well (i.e., one or more), unless the context clearly indicates otherwise. An enumerated listing of items does not imply that any or all of the items are mutually exclusive and/or mutually inclusive, unless expressly specified otherwise. It will be further understood that the terms "comprises," "comprising," "includes" "including," "having," and variations thereof when used herein mean "including but not limited to" unless expressly specified otherwise. That is, these terms may specify the presence of stated features, integers, steps, operations, elements, or components, but do not preclude the presence or addition of one or more other features, integers, steps, operations, elements, components, or groups thereof. Moreover, it is understood that the word "or" has the same meaning as the Boolean operator "OR," that is, it encompasses the possibilities of "either" and "both" and is not limited to "exclusive or" ("XOR"), unless expressly stated otherwise. It is also understood that the symbol "/" between two adjacent words has the same meaning as "or" unless expressly stated otherwise. Moreover, phrases such as "connected to," "coupled to" or "in communication with" are not limited to direct connections unless expressly stated otherwise.

Any reference to an element herein using a designation such as "first," "second," and so forth does not generally limit the quantity or order of those elements. Rather, these designations may be used herein as a convenient method of distinguishing between two or more elements or instances of an element. Thus, a reference to first and second elements does not mean that only two elements may be used there or that the first element must precede the second element in some manner. Also, unless stated otherwise a set of elements may include one or more elements. In addition, terminology of the form "at least one of a, b, or c" or "a, b, c, or any combination thereof" used in the description or the claims means "a or b or c or any combination of these elements." For example, this terminology may include a, or b, or c, or a and b, or a and c, or a and b and c, or 2a, or 2b, or 2c, or 2a and b, and so on.

As used herein, the term "determining" encompasses a wide variety of actions. For example, "determining" may include calculating, computing, processing, deriving, investigating, looking up (e.g., looking up in a table, a database or another data structure), ascertaining, and the like. Also, "determining" may include receiving (e.g., receiving information), accessing (e.g., accessing data in a memory), and the like. Also, "determining" may include resolving, selecting, choosing, establishing, and the like.

What is claimed is:

1. An electrostatic discharge protection circuit, comprising:
 a discharge circuit configured to discharge current from a first node to a second node;

a first timer circuit configured to generate a first signal for a first period of time in response to an electrostatic discharge event;

an activation circuit coupled to the first timer circuit and the discharge circuit, the activation circuit configured to activate the discharge circuit for the first period of time in response to the first signal;

a second timer circuit coupled to the first timer circuit and configured to generate a second signal for a second period of time in response to the first signal, wherein the second period of time is at least twice as long as the first period of time;

a buffer circuit coupled to the second timer circuit and configured to generate a third signal in response to the second signal, the third signal configured to activate the discharge circuit; and a second driver circuit coupled to the first timer circuit to receive the first signal and to the buffer circuit to receive the third signal, the second driver circuit configured to prevent the third signal from activating the discharge circuit in response to the first signal.

2. The electrostatic discharge protection circuit of claim 1, wherein:

the second timer circuit is configured to generate the second signal at a first slew rate; and the buffer circuit is configured to generate the third signal at a second slew rate that is faster than the first slew rate.

3. The electrostatic discharge protection circuit of claim 1, wherein the buffer circuit comprises a first inverter circuit coupled to a second inverter circuit.

4. The electrostatic discharge protection circuit of claim 1, wherein the second timer circuit comprises a voltage-dependent resistance circuit to adjust a resistive-capacitive time constant based on a voltage on the first node.

5. The electrostatic discharge protection circuit of claim 4, wherein the voltage-dependent resistance circuit is coupled between the first node and the second node and comprises a PMOS transistor in series with a resistor directly coupled to the first node.

6. The electrostatic discharge protection circuit of claim 5, further comprising:

a first driver circuit coupled to the first timer circuit to receive the first signal, wherein an output of the first driver circuit is coupled to a gate of the PMOS transistor.

7. The electrostatic discharge protection circuit of claim 6, wherein:

the second timer circuit further comprises an NMOS transistor coupled in series with the PMOS transistor;

the output of the first driver circuit is further coupled to a gate of the NMOS transistor; and an output node for the PMOS transistor and the NMOS transistor is configured to provide the second signal.

8. The electrostatic discharge protection circuit of claim 1, wherein:

the activation circuit comprises a PMOS transistor comprising a first gate and a drain;

the discharge circuit comprises an NMOS transistor comprising a second gate;

the first gate is coupled to the first timer circuit to receive the first signal; and the drain is coupled to the second gate.

9. The electrostatic discharge protection circuit of claim 8, wherein an output of the second driver circuit is coupled to the second gate.

10. The electrostatic discharge protection circuit of claim 1, wherein the second timer circuit and the buffer circuit are configured to commence the second period of time after the first period of time commences and to end the second period of time after the first period of time ends.

11. The electrostatic discharge protection circuit of claim 1, wherein the first period of time is less than 500 nanoseconds.

12. An electrostatic discharge protection circuit, comprising:

means for discharging current from a first node to a second node;

means for generating a first signal for a first period of time in response to an electrostatic discharge event;

means for activating the means for discharging for the first period of time in response to the first signal;

means for generating a second signal for a second period of time in response to the first signal, wherein the second period of time is at least twice as long as the first period of time; and means for buffering the second signal to generate a third signal to activate the means for discharging for the second period of time; and second means for receiving the first signal and the third signal and preventing, in response to the first signal, the third signal from driving a second means signal configured to activate the means for discharging current.

13. The electrostatic discharge protection circuit of claim 12, wherein:

the means for generating the second signal is configured to generate the second signal at a first slew rate; and the means for buffering is configured to generate the third signal at a second slew rate that is faster than the first slew rate.

14. The electrostatic discharge protection circuit of claim 13, wherein the means for generating the second signal comprises means for adjusting a resistive-capacitive time constant based on a voltage on the first node.

15. The electrostatic discharge protection circuit of claim 14, further comprising:

first means for driving a first means signal and coupled to the means for generating the first signal and the means for generating the second signal, wherein the first means for driving the first means signal is configured to provide a fourth signal based on the first signal to the means for generating the second signal.

16. The electrostatic discharge protection circuit of claim 15, further comprising:

second means for driving a second means signal and coupled to the means for buffering and the means for discharging, wherein the second means for driving the second means signal is configured to generate a fifth signal based on the third signal to activate the means for discharging.

17. The electrostatic discharge protection circuit of claim 12, wherein:

the means for generating the second signal and the means for buffering are configured to commence the second period of time after the first period of time commences and to end the second period of time after the first period of time ends, such that the first period of time and the second period of time partially overlap.

18. The electrostatic discharge protection circuit of claim 12, wherein the first period of time is less than 500 nanoseconds.

19. An electrostatic discharge protection method, comprising:
- detecting an electrostatic discharge event;
- generating a first signal for a first period of time in response to the detection of the electrostatic discharge event;
- activating a discharge circuit between a first node and a second node for the first period of time in response to the first signal;
- generating a second signal for a second period of time in response to the first signal, wherein the second period of time is at least twice as long as the first period of time;
- buffering the second signal to generate a third signal configured to activate the discharge circuit;
- preventing the third signal from activating the discharge circuit during the first period of time; and
- activating, after the first period of time, the discharge circuit in response to the third signal.

20. The electrostatic discharge protection method of claim 19, wherein:
- the second signal has a first slew rate; and
- the third signal has a second slew rate that is faster than the first slew rate.

21. The electrostatic discharge protection method of claim 19, wherein the generation of the second signal comprises:
- adjusting a resistive-capacitive time constant of a resistive-capacitive filter based on a voltage on the first node.

22. The electrostatic discharge protection method of claim 19, wherein:
- the first period of time commences before the second period of time commences;
- the second period of time ends after the first period of time ends; and
- the first period of time and the second period of time partially overlap.

23. The electrostatic discharge protection method of claim 19, wherein the first period of time is less than 500 nanoseconds.

* * * * *